(12) United States Patent
Hunt et al.

(10) Patent No.: US 9,278,856 B2
(45) Date of Patent: Mar. 8, 2016

(54) FLEXIBLE SENSING MATERIAL CONTAINING CARBON NANOTUBES

(75) Inventors: Robert N. Hunt, Steubenville, OH (US); Charles Todd Williams, Pittsburgh, PA (US)

(73) Assignee: Covestro LLC, Pittsburgh, PA (US)

( * ) Notice: Subject to any disclaimer, the term of this patent is extended or adjusted under 35 U.S.C. 154(b) by 755 days.

(21) Appl. No.: 13/082,831

(22) Filed: Apr. 8, 2011

(65) Prior Publication Data
US 2012/0258302 A1 Oct. 11, 2012

(51) Int. Cl.
| B82Y 30/00 | (2011.01) |
| G01L 1/20 | (2006.01) |
| H05K 1/03 | (2006.01) |
| H05K 1/16 | (2006.01) |

(52) U.S. Cl.
CPC ............. *B82Y 30/00* (2013.01); *G01L 1/205* (2013.01); *H05K 1/0393* (2013.01); *H05K 1/167* (2013.01); *H05K 2201/026* (2013.01); *H05K 2201/0323* (2013.01); *Y10T 428/24995* (2015.04)

(58) Field of Classification Search
None
See application file for complete search history.

(56) References Cited

U.S. PATENT DOCUMENTS

| 3,806,471 A | 4/1974 | Mitchell |
| 4,314,227 A | 2/1982 | Eventoff |
| 4,489,302 A | 12/1984 | Eventoff |
| 4,734,034 A | 3/1988 | Maness et al. |
| 4,856,993 A | 8/1989 | Maness et al. |
| 5,296,837 A | 3/1994 | Yaniger |
| 6,964,205 B2 | 11/2005 | Papakostas et al. |
| 6,988,925 B2 | 1/2006 | Arthur et al. |
| 7,060,241 B2 | 6/2006 | Glatkowski |
| 7,118,693 B2 | 10/2006 | Glatkowski et al. |
| 7,270,002 B2 | 9/2007 | Chen et al. |
| 7,378,040 B2 | 5/2008 | Luo et al. |
| 7,402,264 B2 | 7/2008 | Ounaies et al. |

(Continued)

FOREIGN PATENT DOCUMENTS

| CN | 1164620 C | 9/2004 |
| CN | 1641820 A | 7/2005 |

(Continued)

OTHER PUBLICATIONS

Iijima, Sumio, Helical Microtubules of Graphitic Carbon, Nature, Nov. 7, 1991, vol. 354, pp. 56-58, NEC Corporation, Fundamental Research Laboratories, Japan.

(Continued)

*Primary Examiner* — Jennifer Chriss
*Assistant Examiner* — Camie Thompson
(74) *Attorney, Agent, or Firm* — John E. Mrozinski, Jr.; Lyndanne M. Whalen

(57) ABSTRACT

The present invention relates to a flexible sensing material made from (a) at least one flexible polymeric layer and (b) at least one conductive, curable coating layer containing about 0.01 wt. % to about 5 wt. % of multi-walled carbon nanotubes having a diameter of greater than about 4 nm, about 10 wt. % to about 99 wt. % of an aliphatic urethane acrylate and about 0.1 wt. % to about 15 wt. % of a photoinitiator, wherein the weight percentages are based on the weight of the formulation, wherein the coating layer is curable by exposure to radiation and wherein the cured coating layer has a surface resistivity of about $10^2 \Omega/\square$ to about $10^{10} \Omega/\square$. The inventive sensing material may prove useful for sensing one or more of pressure, temperature and moisture and find use in a wide variety of applications.

25 Claims, 19 Drawing Sheets

(56) References Cited

U.S. PATENT DOCUMENTS

| | | |
|---|---|---|
| 7,452,828 B2 | 11/2008 | Hirakata et al. |
| 7,622,314 B2 | 11/2009 | Liang |
| 7,730,547 B2 | 6/2010 | Barrera et al. |
| 7,750,240 B2 | 7/2010 | Jiang et al. |
| 2006/0128826 A1 | 6/2006 | Ellison et al. |
| 2012/0010316 A1* | 1/2012 | Meyer et al. .................. 522/33 |

FOREIGN PATENT DOCUMENTS

| | | | |
|---|---|---|---|
| EP | 2228414 | * | 9/2010 |
| JP | 2007063481 A | | 3/2007 |
| JP | 2008037919 A | | 2/2008 |
| JP | 2008179787 A | | 8/2008 |
| JP | 2009155570 A | | 1/2009 |
| JP | 2009040021 A | | 2/2009 |

OTHER PUBLICATIONS

Currie, Edwin P.K. et al. Hybrid Nanociatings in the Display Industry, Journal of the Society for Information Display, 2005, 13(9), pp. 773-780.

Trottier, C.M. et al. Properties and Characterization of Carbon-Nanotube-Based Transparent Conductive Coating. Journal of the Society for Information Display, 2005, 13(9), pp. 759-763.

* cited by examiner

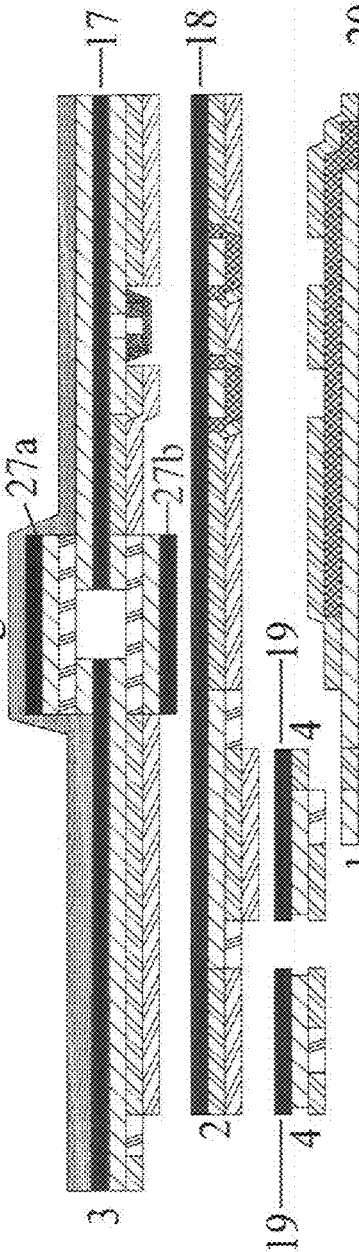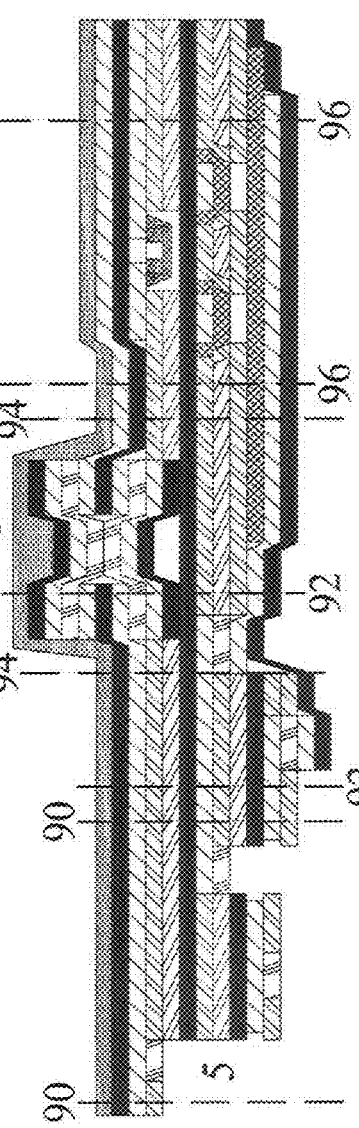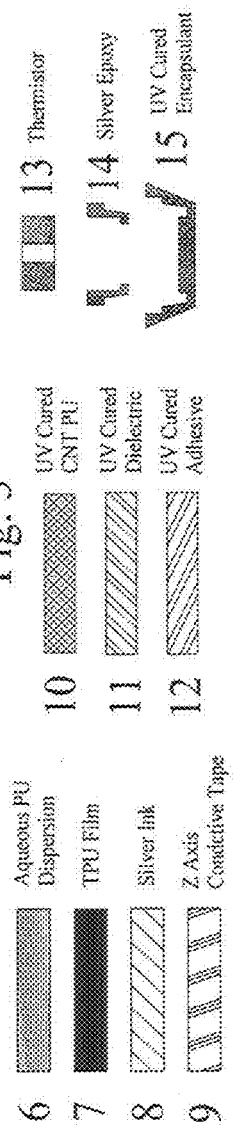

Film 1
Layer 2 CNT
240 Mesh Screen

Film 2
Layer 2 CNT
230 Mesh Screen

Film 2
Layer 3 Dielectric
230 Mesh Screen

Film 2
Layer 4 Adhesive
80 Mesh Screen

Film 3 Side A
Layer 2 Dielectric
240 Mesh Screen

Film 3 Side A
Layer 3 Adheasive
80 Mesh Screen

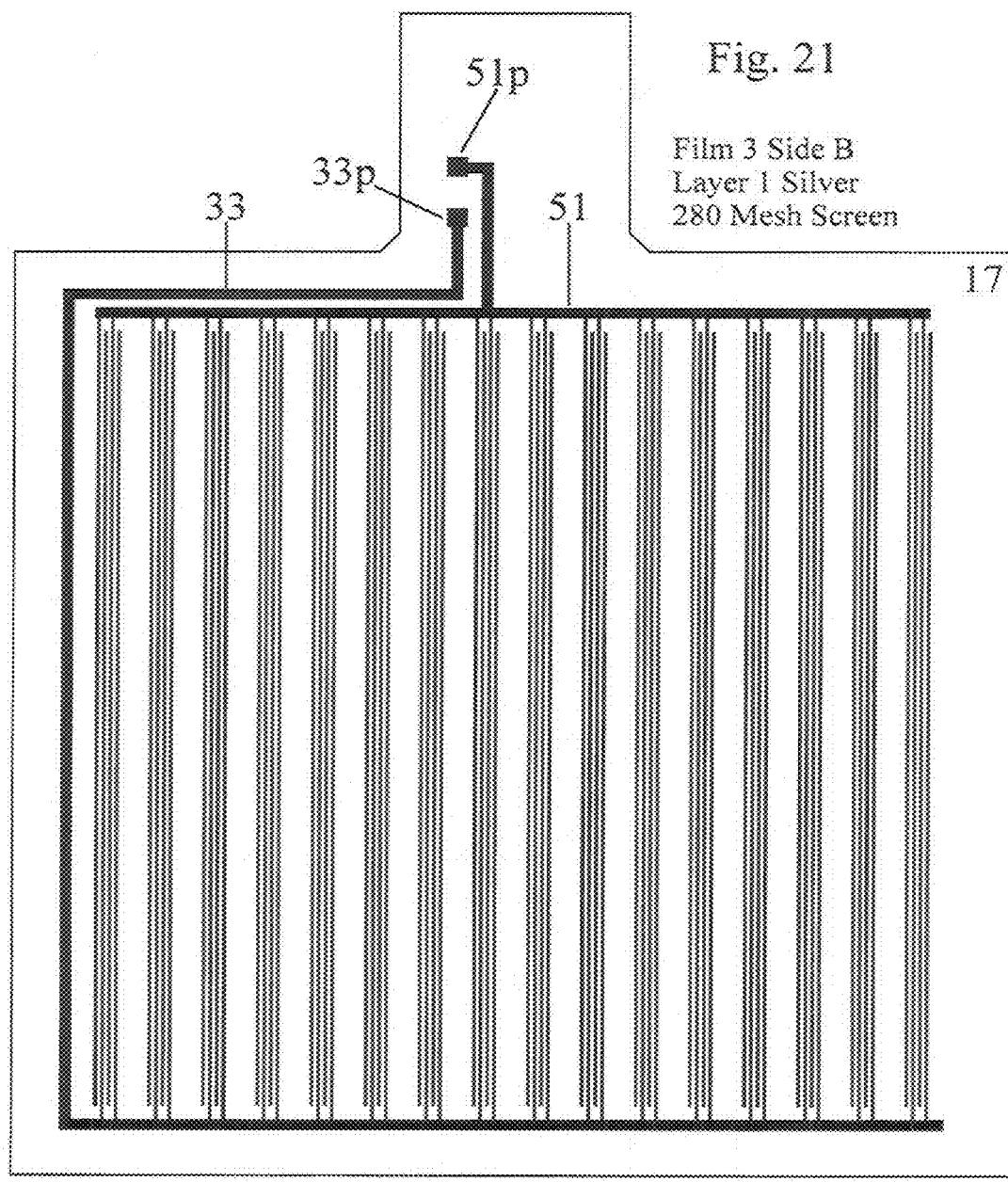

FLEXIBLE SENSING MATERIAL CONTAINING CARBON NANOTUBES

STATEMENT REGARDING FEDERALLY SPONSORED RESEARCH

This invention was made at least in part, through research funded by the U.S. Government under contract number FA 8650-06-3-9000 awarded by the U.S. Air Force Research Laboratory, USAF. The government may have certain rights in the invention.

FIELD OF THE INVENTION

The present invention relates in general to sensors and more specifically to a flexible, multi-layered sensing material for measuring one or more parameters such as pressure, temperature and moisture. The inventive sensing material includes one or more a flexible layers and an ultraviolet (UV) curable coating layer containing conductive carbon nanotubes.

BACKGROUND OF THE INVENTION

Since the discovery of carbon nanotubes in 1991 by Iijima, Nature, 354, pp. 56-58 (1991), extensive research has been carried out involving the synthesis, chemistry, and manipulation of these materials. Carbon nanotubes are electrically conductive along their length, chemically stable, and capable, individually, of having a very small diameter (much less than 100 nanometers) and large aspect ratios (length/diameter).

Force sensors made of resistive inks or materials that can measure applied force by changes in resistance have been known in the art since around 1968 as evidenced by U.S. Pat. No. 3,806,471, issued to Mitchell. Mitchell used a volumetric dispersion of at least partially conductive particles such as molybdenum disulfide in a compressible insulating elastomeric material such as RTV silicon rubber. When a force is applied to compress the material the particles touch and increase the number of conductive paths through the bulk material thereby decreasing the resistance of the material. When the force is removed the material conforms to its original shape and returns to its original resistance. The change in resistance is a bulk material effect and not a surface effect, and as such does not work well in thin film applications. Additionally, the high loadings of conductive particles in the elastomeric material will reduce the elastomeric properties of the bulk material.

U.S. Pat. Nos. 4,489,302 and 4,314,227, both issued to Eventoff, disclose an improved force sensor based on the pressure dependent contact area between a conducting surface and a semiconducting surface having a multiplicity of microprotrusions of the semiconducting material. In one embodiment, the loading of the semiconducting molybdenum disulfide material in the resin surface is between 46% and 63%. Such high loadings of filler will reduce the physical properties of the resin binder, such as flexibility. Eventoff teaches in some of embodiments that the flexible film used as the substrate is MYLAR. The substrate films in Eventoff can conform to a two dimensional surface but cannot conform to a three dimensional surface well without creasing.

Maness et al., in U.S. Pat. No. 4,734,034, disclose a flexible force sensing pad suitable for measuring dental occlusions. Maness et al. teach a flexible high spatial resolution force sensor pad can be fabricated using a matrix of force sensor cells. The force sensor cells are composed of a plurality of flexible parallel electrodes supported by a thin flexible film substrate to provide a set of row electrodes; a second plurality of flexible parallel electrodes supported by a second thin flexible film substrate to provide a set of column electrodes. At least one of the two sets of electrodes is coated with a thin film resistive material, preferably an insulating vinyl ester binder with titanium dioxide filler and butyl cellosolve acetate solvent with a conductive ink containing graphite, vinyl resin, and butyl cellosolve acetate; and oriented such that the two electrode sets face each other to form a matrix of rows and columns that defines a measuring space suitable for measuring dental occlusions. The two sets of electrodes are separated by a resistive layer such as talcum powder to prevent contact until there is an applied force. The response of the force sensor cells as taught by Maness et al. is of a binary nature which either senses an applied force or no applied force but cannot discriminate between small changes in applied force. Maness et al. teach in the preferred embodiment of the invention, the thin film used as the flexible substrate is polyester film such as MYLAR, or similar films such as KAPTON, manufactured by DuPont. The substrate films of Maness et al. can conform to a two dimensional surface but cannot conform to a three dimensional surface well without creasing.

U.S. Pat. No. 4,856,993 also issued to Maness et al., is said to provide an improvement on U.S. Pat. No. 4,734,034, wherein part of the resistive coating between the conductive plurality of flexible parallel electrodes in rows and columns is composed of a graphite-molybdenum disulfide based ink in an acrylic binder. The separating resistive layer (talcum) between the two sets of electrodes is also eliminated. Maness et al. teach the thin film used as the flexible substrate is polyester film such as MYLAR, or similar films such as KAPTON. The substrate films of Maness et al. can conform to a two dimensional surface but cannot conform to a three dimensional surface well without creasing. The pressure sensing resistive layer is composed of high levels of graphite and molybdenum disulfide that reduces the flexibility and mechanical properties of the layer.

U.S. Pat. No. 5,296,837 issued to Yaniger, discloses a pressure transducer based on at least one three-dimensional stannous oxide textured resistive layer juxtaposed to at least one of two conductive layers containing a circuit to measure the resistance between the two conductive layers. The measured resistance is a function of the resistance layers contact area or pressure perpendicular to the resistive layers. In one embodiment, the pressure transducer resistance is dependent on the area of contact between the two juxtaposed resistive layers. At low pressure, just the peaks of the stannous oxide particles of the textured surfaces are in contact giving a high resistance. As the pressure increases, the two resistive layers bend to conform to the valleys between the stannous oxide particles and increase the contact area between the resistive layers. One advantage to this form of pressure transducer is it relies on a surface effect and not a bulk effect and thus may be well suited to thin film applications. However, in the preferred embodiment of Yaniger, the levels of stannous oxide filler can range from 16% to 80% of the conductive resin layer which would have a considerable effect on the physical properties of a thin film, such as flexibility. Yaniger teaches the thin film suitable as the flexible substrate is a polyester film such as MYLAR. Similarly to other referenced patents herein, the substrate films of Yaniger can conform to a two dimensional surface but cannot conform to a three dimensional surface well without creasing.

U.S. Pat. Nos. 6,964,205 and 7,258,026, both issued to Papakostas et al., disclose a method for fabricating a plurality of sensor cells to measure a parameter applied to a surface.

Papakostas et al. try to address the shortcomings in the above-referenced patents on flexibility in the film substrates and flexibility in the resistive measuring layer. Papakostas et al. teach that flexibility and mechanical isolation between cells can be achieved by using spiral-like conductive traces which wrap around at least a portion of the sensor element to interconnect the sensor elements. Papakostas et al. further teach slits or cut-outs in the substrate between the sensor elements will allow sensor elements to move independently of one another. Cut slits in the film will improve the overall flexibility of the film and independent movement of the individual sensor elements, but the sections of the film and sensor cells will still be subject to stress cracking in areas of high flexing loads.

It is known to those skilled in the art that non elastomeric films or substrates in applications that involve extensive flexing will undergo stress cracking over time. The use of sensor pads or films in applications such as shoes, wheelchairs, hospital beds, and car seats has thus been limited due to the robustness of the materials of construction.

Therefore, a need continues to exist in the art for improved materials for sensing one or more parameters such as pressure, temperature and moisture. A need also exists for a highly flexible force sensing cell and sensor array on a highly flexible and elastomeric film substrate. The sensing material should preferably be flexible to permit its use in a wide variety of applications.

SUMMARY OF THE INVENTION

Accordingly, the present invention provides such an improved flexible sensing material which includes at least one flexible polymeric layer and at least one radiation curable coating layer containing carbon nanotubes. The present invention provides improvements in force sensing resistive ink to address flexibility by reducing the loading levels of filler to below about 5 wt. % in an elastomeric resin; improvements in the flexibility of the supporting substrate by using an elastomeric film instead of a ridged film such as MYLAR or KAPTON; and improvements in the fabrication process to allow the use of elastomeric films in multi layer circuit assemblies. Further, the present invention discloses a flexible carbon-nanotube (CNT) conductive ink that can measure moisture or be functionalized to measure chemical or biological constituents on a flexible film. The inventive sensing material may prove useful for sensing one or more of pressure, temperature and moisture and find use in a wide variety of applications.

These and other advantages and benefits of the present invention will be apparent from the Detailed Description of the Invention herein below.

BRIEF DESCRIPTION OF THE FIGURES

The present invention will now be described for purposes of illustration and not limitation in conjunction with the figures, wherein:

FIG. 1 provides an illustration (not to scale) of films of the present invention after screen printing and assembling of individual films prior to laminating the films together;

FIG. 2 shows the films (not to scale) laminated together;

FIG. 3 identifies the layers and components detailed in FIGS. 1 to 9;

FIG. 21 shows the silver ink screen print pattern of the top side of film 3 layer 1 of an embodiment of this invention, a force sensing pad.

DETAILED DESCRIPTION OF THE INVENTION

Figure 4:
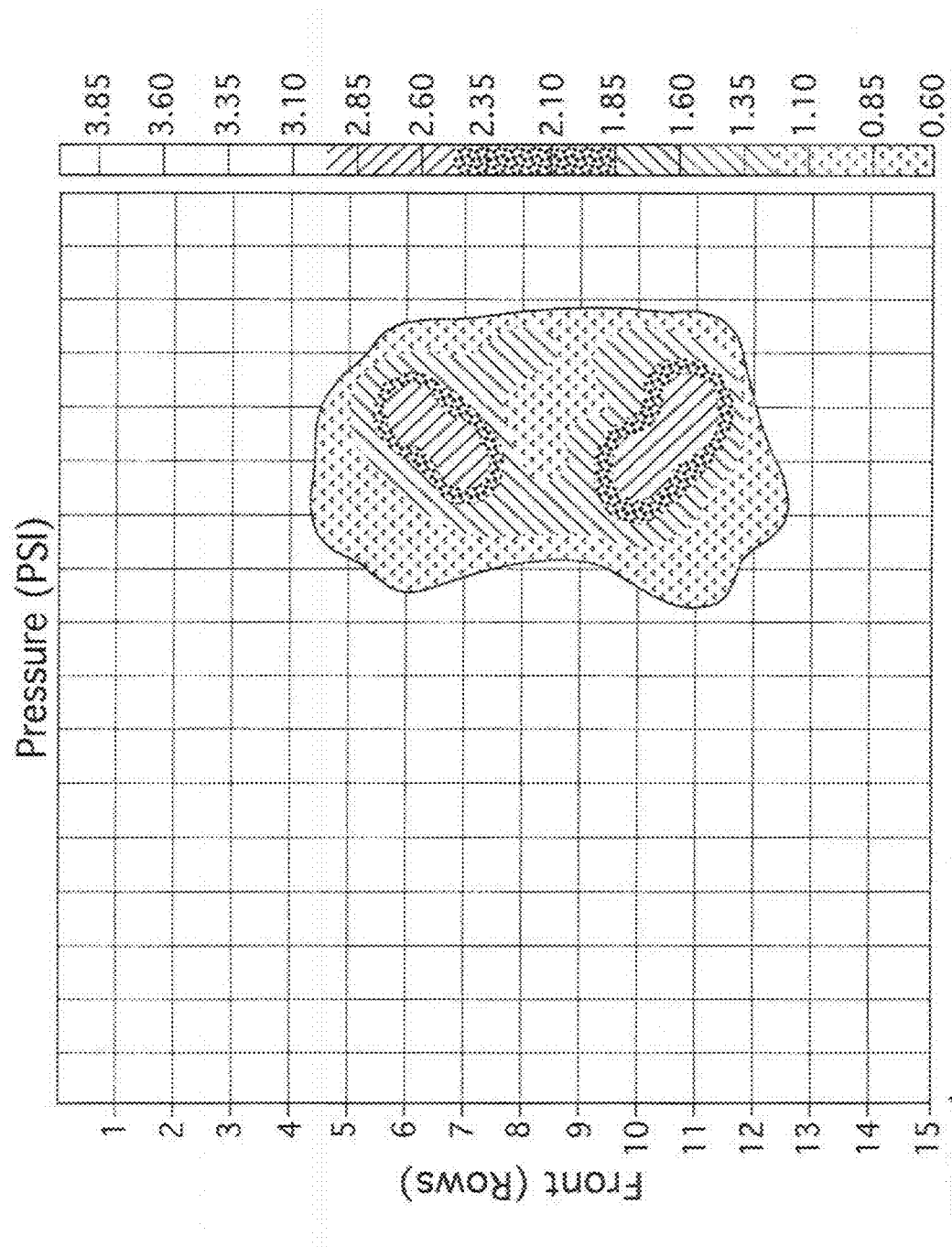
FIG. 4 illustrates a pressure image of a person sitting on a preferred embodiment of the inventive force sensing pad.

The present invention will now be described for purposes of illustration and not limitation. Except in the operating examples, or where otherwise indicated, all numbers expressing quantities, percentages, OH numbers, functionalities and so forth in the specification are to be understood as being modified in all instances by the term "about." Equivalent weights and molecular weights given herein in Daltons (Da) are number average equivalent weights and number average molecular weights respectively, unless indicated otherwise.

The present invention provides a flexible sensing material made from (a) at least one flexible polymeric layer and (b) at least one conductive, curable coating layer containing 0.01 wt. % to 5 wt. % of multi-walled carbon nanotubes having a diameter of greater than 4 nm, 10 wt. % to 99 wt. % of an aliphatic urethane acrylate and 0.1 wt. % to 15 wt. % of a photoinitiator, wherein the weight percentages are based on the weight of the formulation, wherein the coating layer is curable by exposure to radiation and wherein the cured coating layer has a surface resistivity of $10^2 \Omega/\square$ to $10^{10} \Omega/\square$.

The present invention also provides a process for producing a flexible sensing material involving combining (a) at least one flexible polymeric layer and (b) at least one conductive, curable coating layer made from 0.01 wt. % to 5 wt. % of multi-walled carbon nanotubes having a diameter of greater than 4 nm, 10 wt. % to 99 wt. % of an aliphatic urethane acrylate and 0.1 wt. % to 15 wt. % of a photoinitiator, wherein the weight percentages are based on the weight of the formulation, wherein the coating layer is curable by exposure to radiation and wherein the cured coating layer has a surface resistivity of $10^2 \Omega/\square$ to $10^{10} \Omega/\square$.

The present invention discloses preferred materials and methods for combining those materials to form the elastomeric dielectric substrates, conductive circuit interconnect elements, and sensor elements. It is not necessarily apparent to those skilled in the art that elastomeric films such as polyurethane would be preferred over non elastomeric films such as polyester (MYLAR) for force sensing pads. The preference for non elastomeric films in the printing and fabrication process is apparent when registration between layers is critical. Therefore, the instant invention also discloses how elastomeric films may be processed to fabricate multilayer circuits and maintain the required registration between layers.

Thermoplastic polyurethanes (TPU) are preferably employed as the polymeric layer in the present invention due to their flexibility, durability, tear and cut resistance and diverse chemistry. Thermoplastic polyurethane elastomers are well known to those skilled in the art. They are of commercial importance due to their combination of high-grade mechanical properties with the known advantages of cost-effective thermoplastic processability. A wide range of variation in their mechanical properties can be achieved by the use of different chemical synthesis components. A review of thermoplastic polyurethanes, their properties and applications is given in Kunststoffe [*Plastics*] 68 (1978), pages 819 to 825, and in Kautschuk, Gummi, Kunststoffe [*Natural and Vulcanized Rubber and Plastics*] 35 (1982), pages 568 to 584.

Thermoplastic polyurethanes are synthesized from linear polyols, mainly polyester diols or polyether diols, organic diisocyanates and short chain diols (chain extenders). Catalysts may be added to the reaction to speed up the reaction of the components.

The relative amounts of the components may be varied over a wide range of molar ratios in order to adjust the properties. Molar ratios of polyols to chain extenders from 1:1 to 1:12 have been reported. These result in products with hardness values ranging from 80 Shore A to 75 Shore D.

Thermoplastic polyurethanes can be produced either in stages (prepolymer method) or by the simultaneous reaction of all the components in one step (one shot). In the former, a prepolymer formed from the polyol and diisocyanate is first formed and then reacted with the chain extender. Thermoplastic polyurethanes may be produced continuously or batch-wise. The best-known industrial production processes are the so-called belt process and the extruder process.

Examples of the suitable polyols include difunctional polyether polyols, polyester polyols, and polycarbonate polyols. Small amounts of trifunctional polyols may be used, yet care must be taken to make certain that the thermoplasticity of the thermoplastic polyurethane remains substantially unaffected.

Suitable polyester polyols include those prepared by polymerizing ε-caprolactone using an initiator such as ethylene glycol, ethanolamine and the like. Further suitable examples are those prepared by esterification of polycarboxylic acids. The polycarboxylic acids may be aliphatic, cycloaliphatic, aromatic and/or heterocyclic and they may be substituted, e.g., by halogen atoms, and/or unsaturated. The following are mentioned as examples: succinic acid; adipic acid; suberic acid; azelaic acid; sebacic acid; phthalic acid; isophthalic acid; trimellitic acid; phthalic acid anhydride; tetrahydrophthalic acid anhydride; hexahydrophthalic acid anhydride; tetrachlorophthalic acid anhydride, endomethylene tetrahydrophthalic acid anhydride; glutaric acid anhydride; maleic acid; maleic acid anhydride; fumaric acid; dimeric and trimeric fatty acids such as oleic acid, which may be mixed with monomeric fatty acids; dimethyl terephthalates and bis-glycol terephthalate. Suitable polyhydric alcohols include, e.g., ethylene glycol; propylene glycol-(1,2) and -(1,3); butylene glycol-(1,4) and -(1,3); hexanediol-(1,6); octanediol-(1,8); neopentyl glycol; (1,4-bis-hydroxy-methylcyclohexane); 2-methyl-1,3-propanediol; 2,2,4-tri-methyl-1,3-pentanediol; triethylene glycol; tetraethylene glycol; polyethylene glycol; dipropylenc glycol; polypropylene glycol; dibutylene glycol and polybutylene glycol, glycerine and trimethlyolpropane.

Suitable polyisocyanates for producing the thermoplastic polyurethanes useful in the present invention may be, for example, organic aliphatic diisocyanates including, for example, 1,4-tetramethylene diisocyanate, 1,6-hexamethylene diisocyanate, 2,2,4-trimethyl-1,6-hexamethylene diisocyanate, 1,12-dodecamethylene diisocyanate, cyclohexane-1,3- and -1,4-diisocyanate, 1-isocyanato-2-isocyanatomethyl cyclopentane, 1-isocyanato-3-isocyanatomethyl-3,5,5-trimethyl-cyclohexane (isophorone diisocyanate or IPDI), bis-(4-isocyanatocyclohexyl)-methane, 2,4'-dicyclohexylmethane diisocyanate, 1,3- and 1,4-bis-(isocyanatomethyl)-cyclohexane, bis-(4-isocyanato-3-methylcyclohexyl)-methane, α,α, α',α'-tetramethyl-1,3- and/or -1,4-xylylene diisocyanate, 1-isocyanato-1-methyl-4(3)-isocyanatomethyl cyclohexane, 2,4- and/or 2,6-hexahydrotoluoylene diisocyanate, and mixtures thereof.

Preferred chain extenders with molecular weights of 62 to 500 include aliphatic diols containing 2 to 14 carbon atoms, such as ethanediol, 1,6-hexanediol, diethylene glycol, dipropylene glycol, and 1,4-butanediol in particular, for example. However, diesters of terephthalic acid with glycols containing 2 to 4 carbon atoms are also suitable, such as terephthalic acid-bis-ethylene glycol or -1,4-butanediol for example, or hydroxyalkyl ethers of hydroquinone, such as 1,4-di-(β-hydroxyethyl)-hydroquinone for example, or (cyclo)aliphatic diamines, such as isophorone diamine, 1,2- and 1,3-propylenediamine, N-methyl-propylenediamine-1,3 or N,N'-dimethyl-ethylenediamine, for example, and aromatic diamines, such as toluene 2,4- and 2,6-diamines, 3,5-diethyltoluene 2,4- and/or 2,6-diamine, and primary ortho-, di-, tri- and/or tetraalkyl-substituted 4,4'-diaminodiphenylmethanes, for example. Mixtures of the aforementioned chain extenders may also be used. Optionally, triol chain extenders having a molecular weight of 62 to 500 may also be used. Moreover, customary monofunctional compounds may also be used in small amounts, e.g., as chain terminators or demolding agents. Alcohols such as octanol and stearyl alcohol or amines such as butylamine and stearylamine may be cited as examples.

To prepare the thermoplastic polyurethanes, the synthesis components may be reacted, optionally in the presence of catalysts, auxiliary agents and/or additives, in amounts such that the equivalent ratio of NCO groups to the sum of the groups which react with NCO, particularly the OH groups of the low molecular weight diols/triols and polyols, is 0.9:1.0 to 1.2:1.0, preferably 0.95:1.0 to 1.10:1.0.

Suitable catalysts include tertiary amines which are known in the art, such as triethylamine, dimethyl-cyclohexylamine, N-methylmorpholine, N,N'-dimethyl-piperazine, 2-(dimethyl-aminoethoxy)-ethanol, diazabicyclo-(2,2,2)-octane and the like, for example, as well as organic metal compounds in particular, such as titanic acid esters, iron compounds, tin compounds, e.g., tin diacetate, tin dioctoate, tin dilaurate or the dialkyltin salts of aliphatic carboxylic acids such as dibutyltin diacetate, dibutyltin dilaurate or the like. The preferred catalysts are organic metal compounds, particularly titanic acid esters and iron and/or tin compounds.

In addition to difunctional chain extenders, small quantities of up to about 5 mol-%, based on mots of the bifunctional chain extender used, of trifunctional or more than trifunctional chain extenders may also be used.

Trifunctional or more than trifunctional chain extenders of the type in question are, for example, glycerol, trimethylolpropane, hexanetriol, pentaerythritol and triethanolamine.

Suitable thermoplastic polyurethanes are available in commerce, for instance, from Bayer MaterialScience under the TEXIN trademark.

The conductive, curable coating layer containing carbon nanotubes useful in the present invention is preferably made according to co-assigned, co-pending U.S. patent application Ser. No. 13/082,763, filed on an even date herewith, the entire contents of which is incorporated by reference thereto.

Aliphatic urethane acrylates are preferred for use in the conductive, radiation-curable coating layer of the present invention, with trifunctional aliphatic polyester urethane acrylate oligomers being most preferred, although monomers such as isobornyl acrylate (SR506A from Sartomer) may prove useful in some applications. Illustrative of aliphatic urethane acrylates suitable for use in the present invention include those marketed by Bayer MaterialScience LLC (DESMOLUX U 680 H, DESMOLUX VP LS 2265, DESMOLUX U 100, DESMOLUX U-500, DESMOLUX XP 2491, and DESMOLUX XP 2513), Cognis (PHOTOMER), Cytec Surface Specialties (EBECRYL), Kowa (NK OLIGO U24A and U-15HA), Rahn (GENOMER) and Sartomer. Additional suppliers of aliphatic urethane acrylates include the BR series of aliphatic urethane acrylates (for example, BR 144 and 970) available from Bomar Specialties or the LAROMER series of aliphatic urethane acrylates from BASF.

The aliphatic urethane acrylate may preferably be present in the conductive, radiation-curable coating layer of the invention an amount of from 10 to 99 wt %, more preferably from 50 to 90 wt %, and most preferably from 40 to 80 wt %, based on the total weight of the coating layer formulation. The aliphatic urethane acrylate may be present in the conductive, radiation-curable coating layer of the present invention in an amount ranging between any combination of these values, inclusive of the recited values.

Photoinitiators are well known to those skilled in the art and are agents that when present in a composition exposed to the correct energy and irradiance in a required band of UV light, polymerization occurs and so the composition hardens or cures. Photoinitiators useful for photocuring free-radically polyfunctional acrylates include benzophenone (e.g., benzophenone, alkyl-substituted benzophenone, or alkoxy-substituted benzophenone); benzoin (e.g., benzoin, benzoin ethers, such as benzoin methyl ether, benzoin ethyl ether, and benzoin isopropyl ether, benzoin phenyl ether, and benzoin acetate); acetophenone, such as acetophenone, 2,2-dimethoxyacetophenone, 4-(phenylthio)acetophenone, and 1,1-dichloroacetophenone; benzil ketal, such as benzil dimethyl ketal, and benzil diethyl ketal; anthraquinone, such as 2-methylanthraquinone, 2-ethylanthraquinone, 2-tertbutylanthraquinone, 1-chloroanthraquinone, and 2-amylanthraquinone; triphenylphosphine; benzoylphosphine oxides, such as, for example, 2,4,6-trimethylbenzoyl-diphenylphosphine oxide; thioxanthone or xanthone; acridine derivative; phenazene derivative; quinoxaline derivative; 1-phenyl-1,2-propanedione-2-O-benzoyloxime; 1-aminophenyl ketone or 1-hydroxyphenyl ketone, such as 1-hydroxycyclohexyl phenyl ketone, phenyl (1-hydroxyisopropyl)ketone and 4-isopropylphenyl(1-hydroxyisopropyl)ketone; or a triazine compound, for example, 4'''-methyl thiophenyl-1-di(trichloromethyl)-3,5-S-triazine, S-triazine-2-(stilbene)-4,6-bistrichloromethyl, or paramethoxy styryl triazine.

Other photoinitiators include benzoin or its derivative such as α-methylbenzoin; U-phenylbenzoin; α-allylbenzoin; α-benzylbenzoin; benzoin ethers such as benzil dimethyl ketal (available as IRGACURE 651 from Ciba Specialty Chemicals), benzoin n-butyl ether; acetophenone or its derivative, such as 2-hydroxy-2-methyl-1-phenyl-1-propanone (available as DAROCUR 1173 from Ciba Specialty Chemicals) and 1-hydroxycyclohexyl phenyl ketone (available as IRGACURE 184 from Ciba Specialty Chemicals); 2-methyl-1-[4-(methylthio)phenyl]-2-(4-morpholinyl)-1-propanone (available as IRGACURE 907 from Ciba Specialty Chemicals); 2-benzyl-2-(dimethlamino)-1-[4-(4-morpholinyl)phenyl]-1-butanone (available as IRGACURE 369 from Ciba Specialty Chemicals); or a blend thereof.

Another useful photoinitiator includes pivaloin ethyl ether, anisoin ethyl ether; a titanium complex such as bis(η5-2,4-cyclopentadienyl)bis[2,-6-difluoro-3-(1H-pyrrolyl)phenyl] t-itanium (commercially available as CGI784DC, also from Ciba Specialty Chemicals); a halomethylnitrobenzene such as 4-bromomethylnitrobenzene and the like; or mono- or bis-acylphosphine (available from Ciba Specialty Chemicals as IRGACURE 1700, IRGACURE 1800, IRGACURE 1850, and DAROCUR 4265). A particularly preferred photoinitiator in the present invention is 20% phosphine oxide, phenyl bis(2,4,6-trimethyl benzoyl)/80% 2-hydroxy-2-methyl-1-phenyl-1-propanone, (available as IRGACURE 2022 from Ciba Specialty Chemicals). Combinations of the aforementioned photoinitiators may also prove useful in the present invention.

The photoinitiator may preferably be present in the conductive, radiation-curable coating layer of the present invention an amount of from 0.1 to 15 wt %, more preferably from 1 to 7 wt %, and most preferably from 3 to 5 wt %, based on the total weight of the coating layer formulation. The photoinitiator may be present in the conductive radiation-curable coating layer of the present invention in an amount ranging between any combination of these values, inclusive of the recited values.

Carbon nanotubes may be classified into single-walled carbon nanotubes which are rolled graphene sheets, and multi-walled carbon nanotubes, which are nested cylindrical carbon nanotubes with different diameters.

In multi-walled carbon nanotubes, inner and outer adjacent layers are separated by a distance of 0.3 to 0.4 nm. The space between the two layers is filled with π electron clouds of carbon atoms constituting six-membered rings of the individual layers. The inner and outer layers are concentrically arranged at a constant distance.

Multi-walled carbon nanotubes useful in the present invention may preferably be-used as obtained from the manufacturer at the 95% purity and no additional purification need be done. Multi-walled carbon nanotubes useful in the present invention preferably have a diameter of greater than 4 nm, more preferably between 5-20 nm, a mean diameter of 13-16 nm, and a length of 1->10 μm with a purity of at least 95%. Multi-wall carbon nanotubes useful in the present invention can be produced by a variety of methods, known to those skilled in the art. Some preferred process are described in U.S. Published Patent Application Nos. 2008/0003170, 2008/0293853, 2009/0023851, 2009/0124705 and 2009/0140215, the entire contents of which are incorporated by reference herein.

The multi-walled carbon nanotubes may preferably be present in the conductive, radiation-curable coating layer of the present invention an amount of from 0.01 to 5 wt %, more preferably from 0.1 to 3 wt %, and most preferably from 2 to 3 wt %, based on the total weight of the coating layer formulation. The multi-walled carbon nanotubes may be present in the conductive, radiation-curable coating layer of the present invention in an amount ranging between any combination of these values, inclusive of the recited values. Resistivities in the range of $10^2$ to $10^{10} \Omega/\square$ may be achieved by adjusting the amount of multi-walled carbon nanotubes in the conductive, radiation-curable coating layer formulation.

Numerous applications exist for flexible, multi-layered sensing material for measuring one or more parameters such as pressure, temperature and moisture. FIG. 1 is a cut away side view of the electrical circuits assemblies 1, 2, 3, and 4 that have been screen printed on to four individual thermoplastic polyurethane films 17, 18, 19, and 20. Each of these four films may contain circuit traces, sensors, or components of sensors spread over multiple films which are preferably not active until the films are laminated together in one assembly 5 as shown in FIG. 2. FIG. 3 identifies each of the ten materials used in fabricating the flexible sensor film assembly of the present Examples. In a certain embodiments, all polymers are elastomeric to provide maximum flexibility. If a rigid component such as a thermistor is to be mounted on the pad the physical size should preferably be made as small as possible, the use of silver epoxy is limited in area and the component encapsulated with a semi-rigid polymer to act as strain relief and to protect the component to circuit trace connection.

Figure 5:
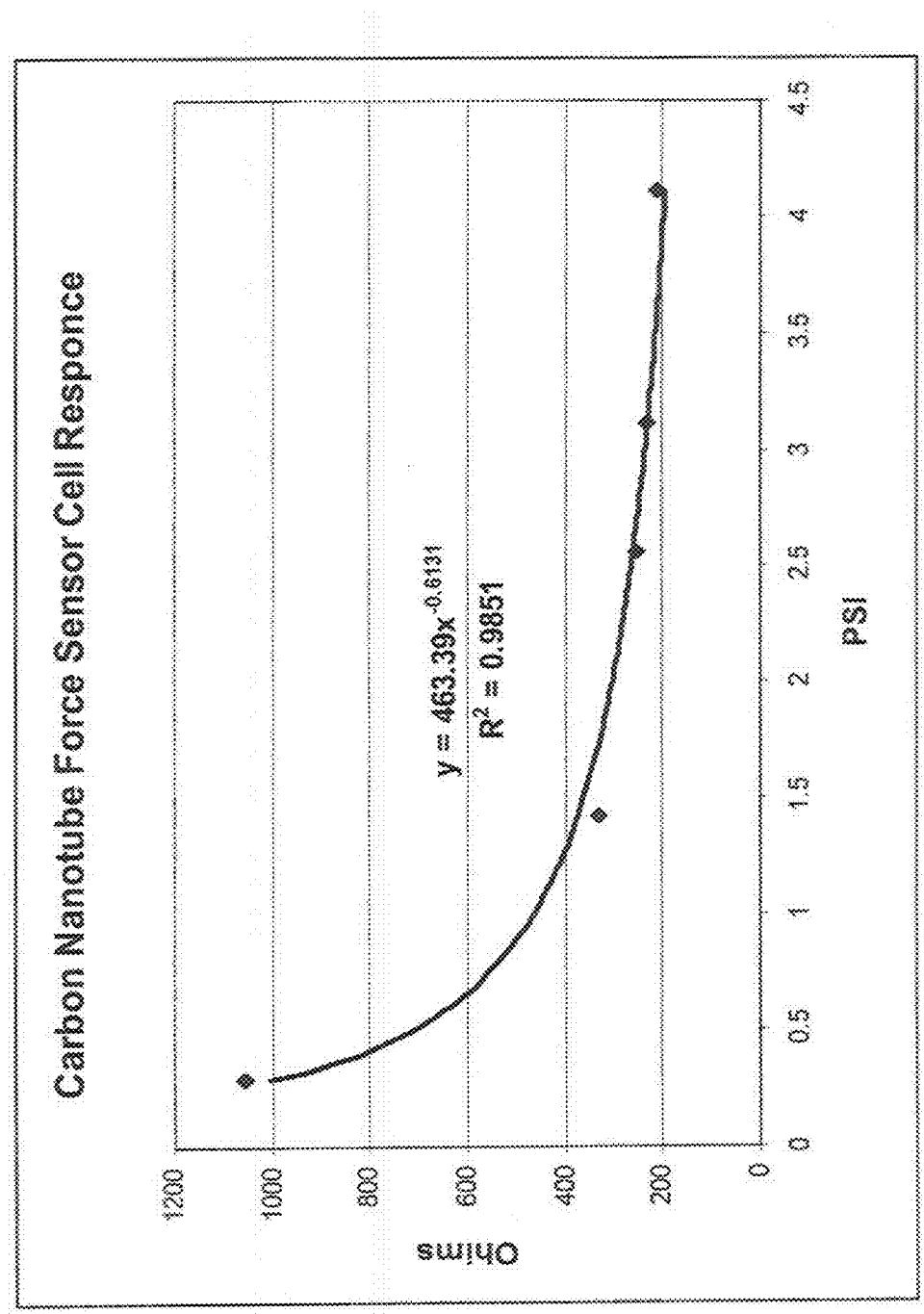
FIG. 5 depicts the force versus resistance for the carbon nanotube force cell useful in the present invention.

The flexible sensor film assembly disclosed in one embodiment of the present invention is a force sensing pad for wheelchair applications. The pad preferably incorporates an array of 256 force sensors for imaging the pressure points when a person is seated on the wheelchair. FIG. 4 shows the response of the force sensing pad in the embodiment detailed in Example 1. FIG. 5 provides a response graph of a force sensor cell showing the resistance (ohms) vs. force load (psi) for the force pad of Example 1.

Figure 6:
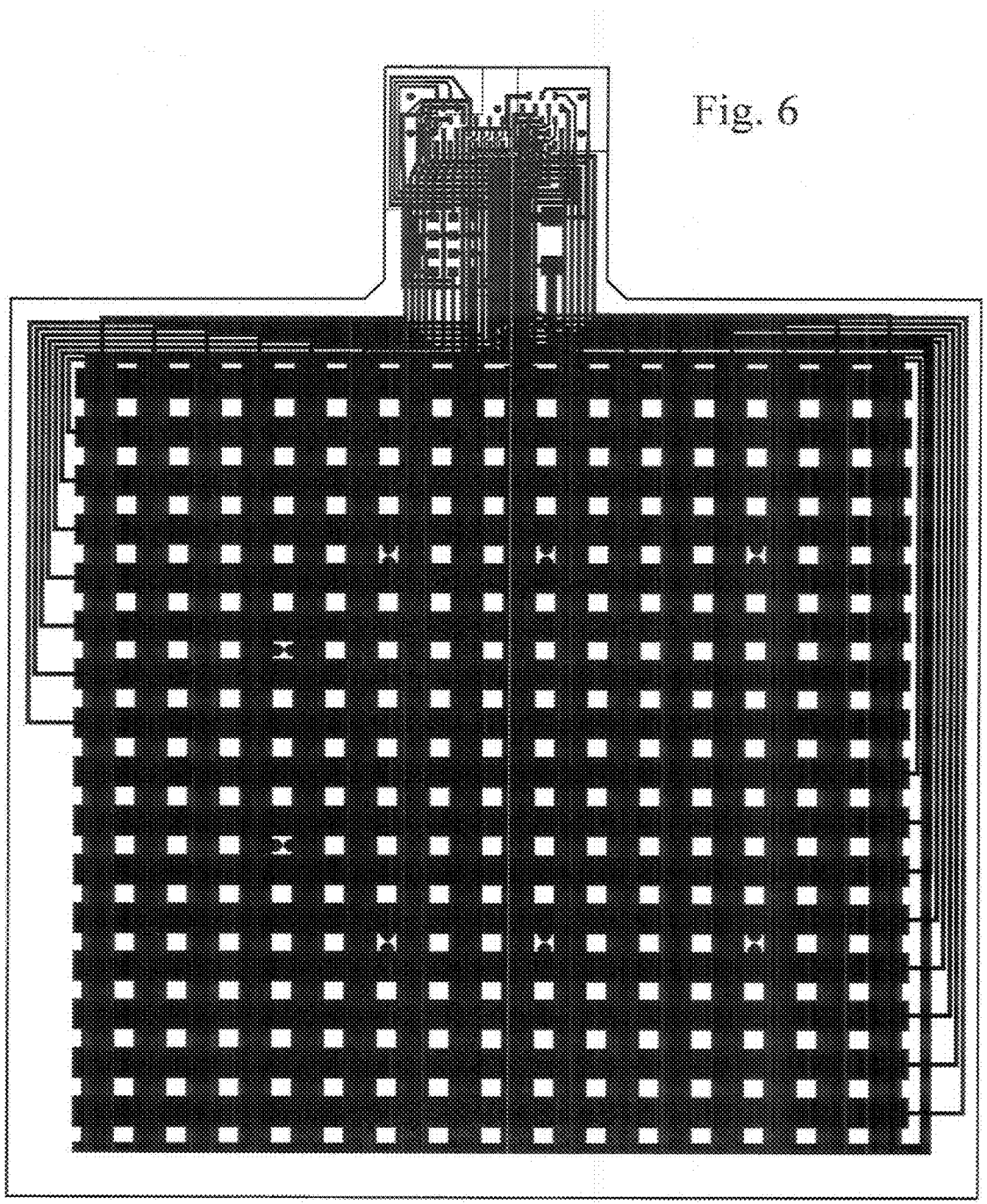
FIG. 6 illustrates an X-ray view (not to scale) of the conductive silver and carbon nanotube layers of an embodiment of the inventive force sensing pad.

In addition, the pad may preferably incorporate several thermistors for temperature measurement and a comb arrangement of electrodes for moisture measurement on the top surface. Force, temperature, and moisture have been suggested as critical parameters in the development of pressure ulcers among those confined to wheelchairs or hospital beds. The complexity of circuit traces for the force pad is shown in FIG. 6, an X-ray view through the pad showing the conductive silver and carbon nanotube traces. This complexity requires the use of multiple film substrates for routing the circuit traces from the controller board to each of the sensors. Each of the film substrates may preferably have printed on it a combination of conductive silver circuit traces; conductive carbon nanotube traces that form the resistive ink pressure sensing force cells; insulating dielectric layers; and adhesive layers for laminating the films together into one permanent assembly. Thermistors may preferably be mounted on circuit pads using silver epoxy and encapsulated with a semi-rigid polymer. Further, film to film and film to circuit board connections may preferably be made using z-axis conductive tape and through hole vias are fabricated in the films, where necessary, using silver printed film patches and z-axis conductive tape. Registration between layers is critical and requires the thin elastomeric films be laminated onto a substrate which will not stretch during the printing process. In a preferred embodiment detailed here and in the example, the flexible sensor films are fabricated using screen printing, however the present inventors contemplate that any printing method which can deposit the required inks may be used.

Each of the fabricated circuit components of the force pad in FIG. 2 will now be described in conjunction with FIGS. 6 through 21.

Figure 7:
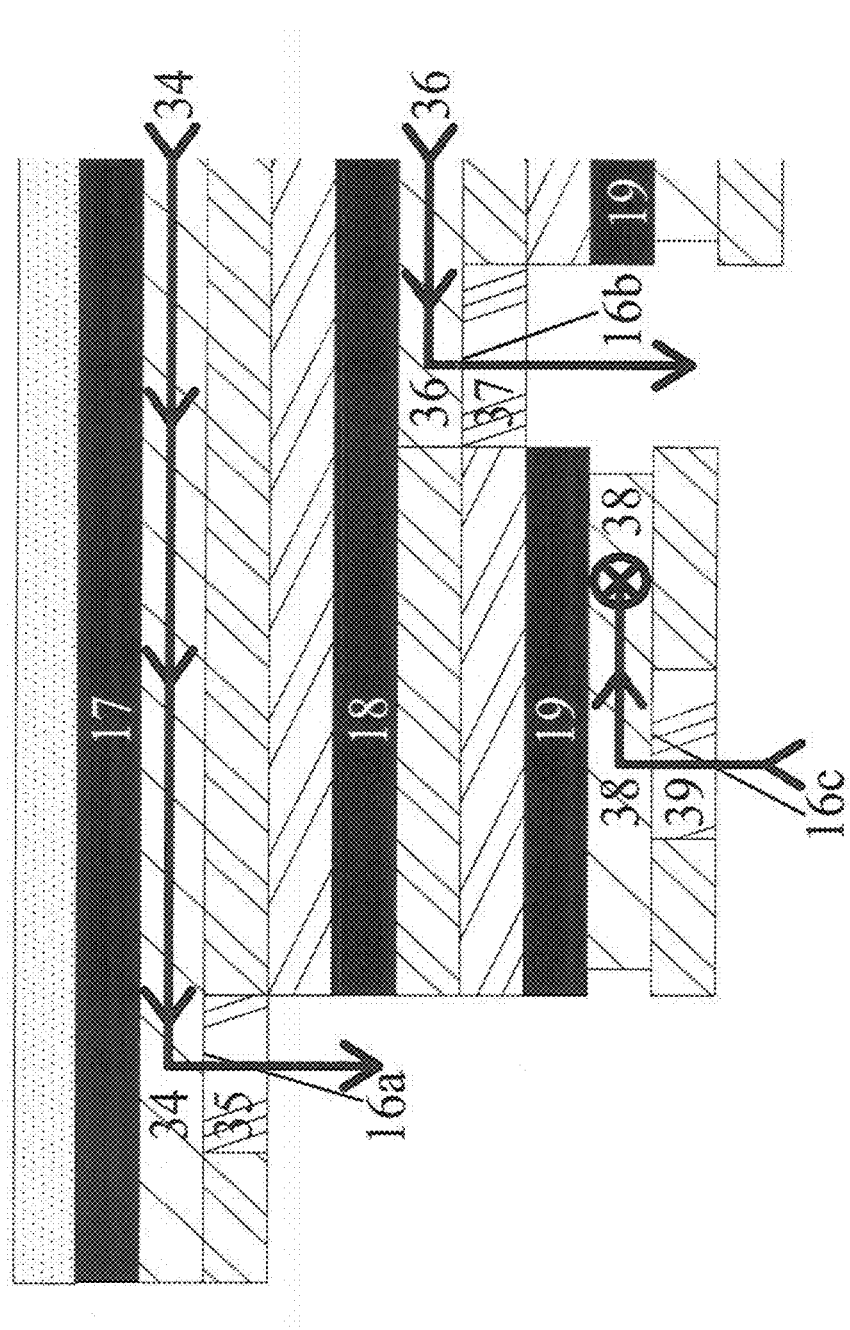
FIG. 7 presents an enlarged view (not to scale) of FIG. 2 taken at lines 90 showing pads on several film layers for connection to an external electronic circuit for control and data interface.

On the left hand side of FIG. 2, (section taken at lines 90) are three connection pads for interfacing an external controller board detailed in an expanded view in FIG. 7 as 16a, 16b and 16c.

Figure 18:
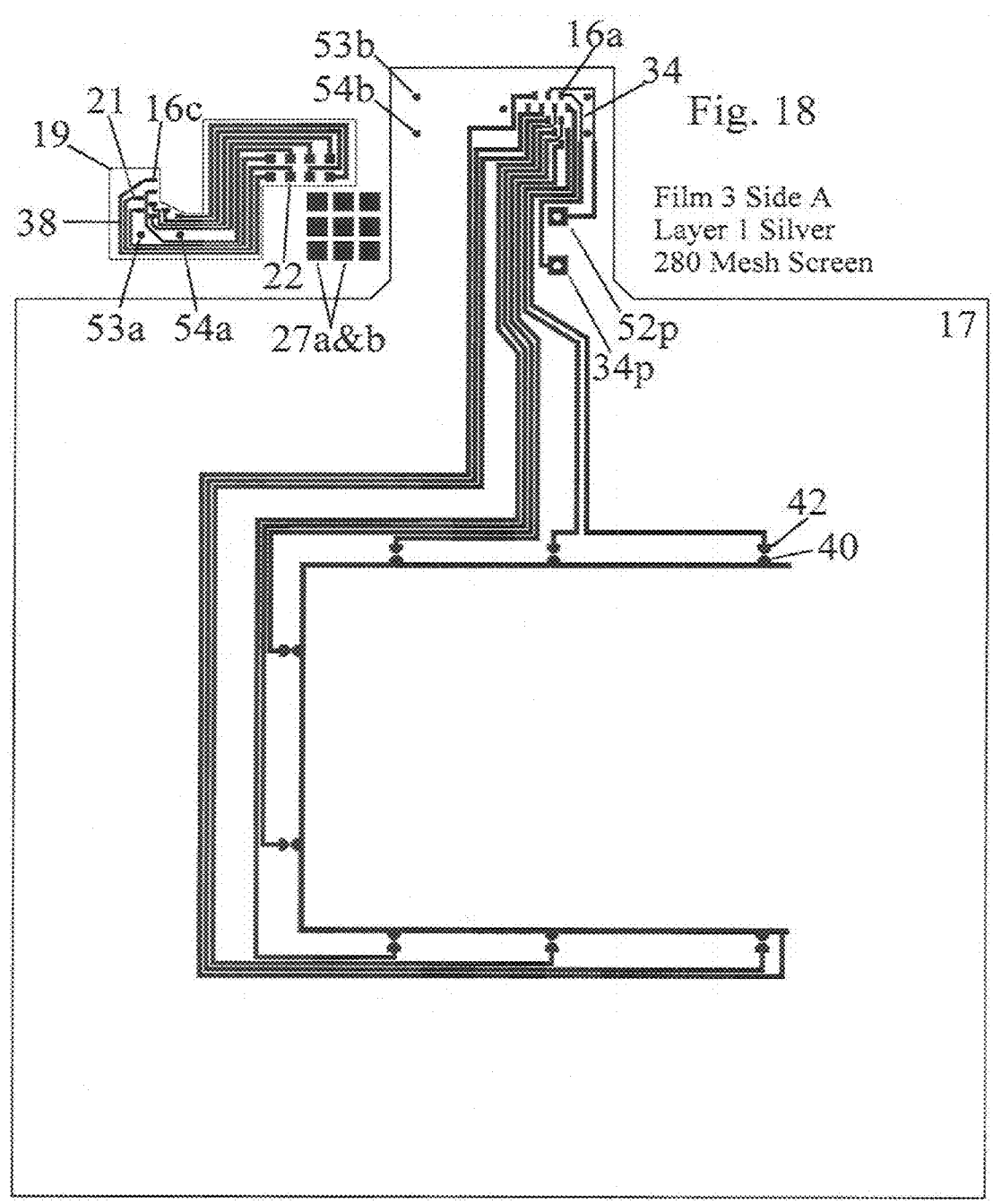
FIG. 18 illustrates the silver ink screen print pattern of the bottom-side of film 3 Side Layer 1 of an embodiment of the inventive force sensing pad.
Figure 19:
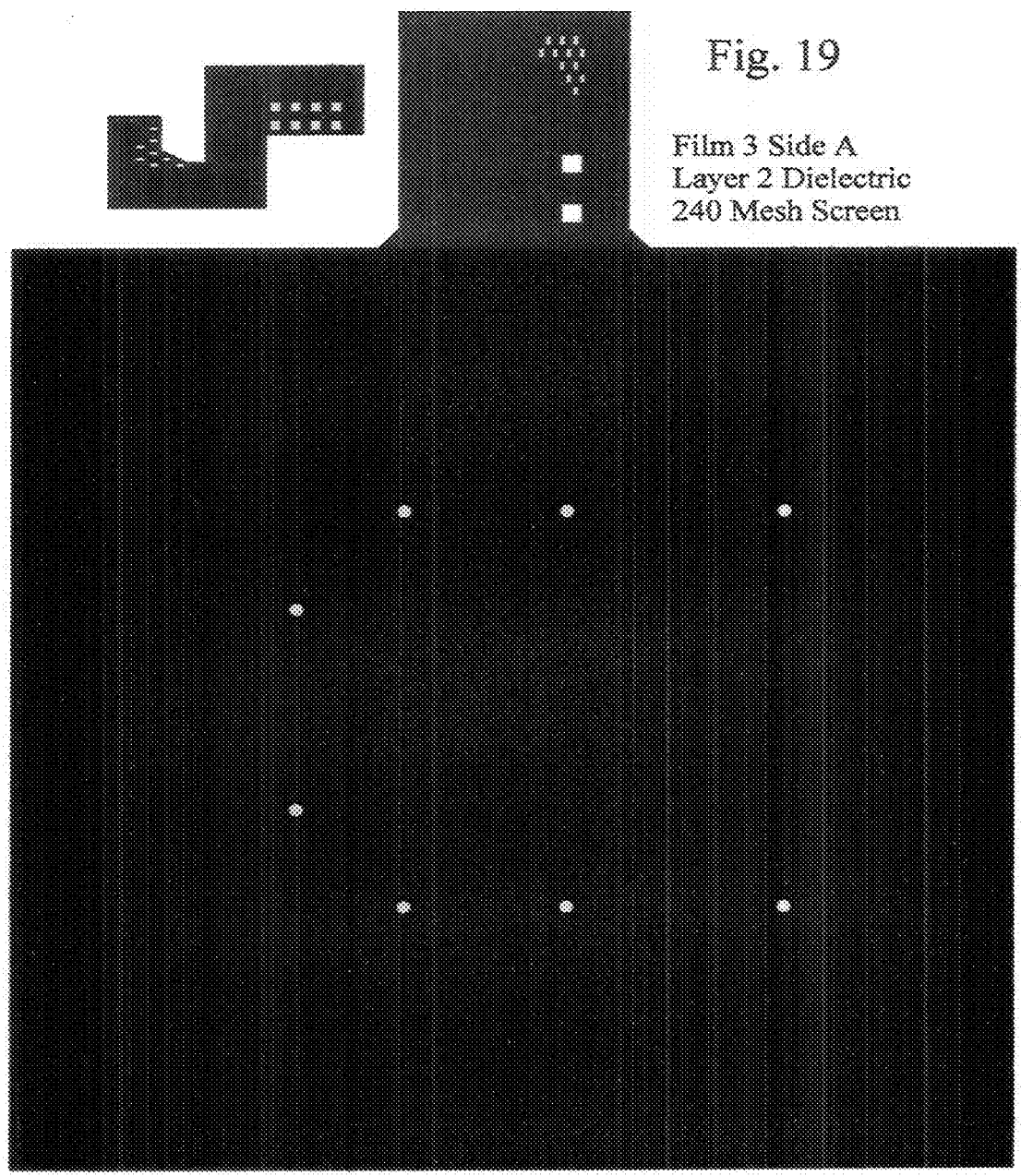
FIG. 19 shows the UV-cured dielectric ink screen print pattern of the bottom side of film 3 layer 2 of an embodiment of the present invention.
Figure 20:
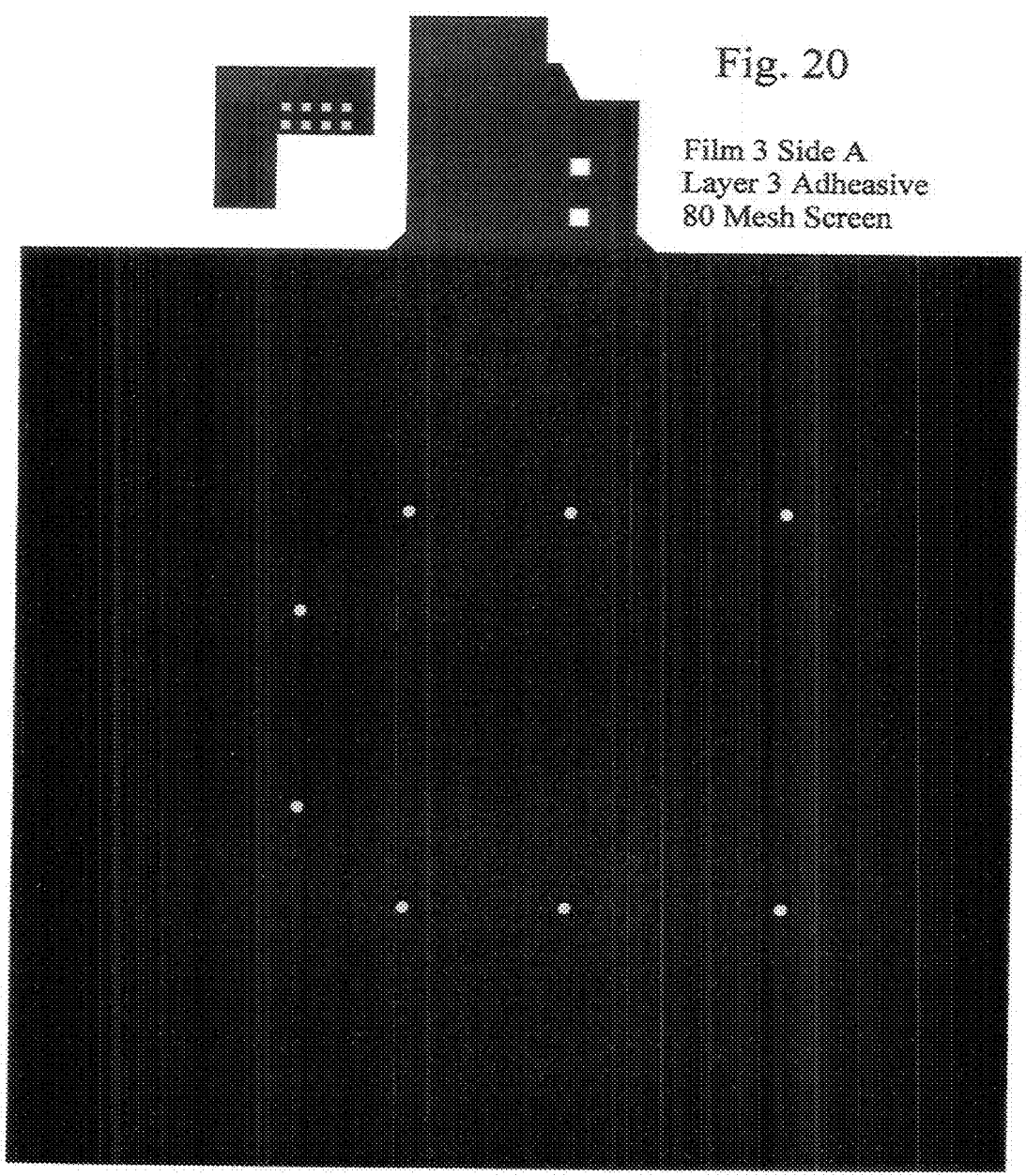
FIG. 20 depicts the UV-cured adhesive ink screen print pattern of the bottom side of film 3 layer 3 of an embodiment of this invention, a force sensing pad.

Silver circuit trace 34 is preferably screen printed on first elastomeric (thermoplastic polyurethane) film 17 and is preferably printed from the screen pattern of FIG. 18 as Film 3 Side A Layer 1. A patch of conductive z-axis tape 35 is preferably placed over the exposed silver pad 16a of trace 34 to complete the connection to the circuit board.

Figure 14:
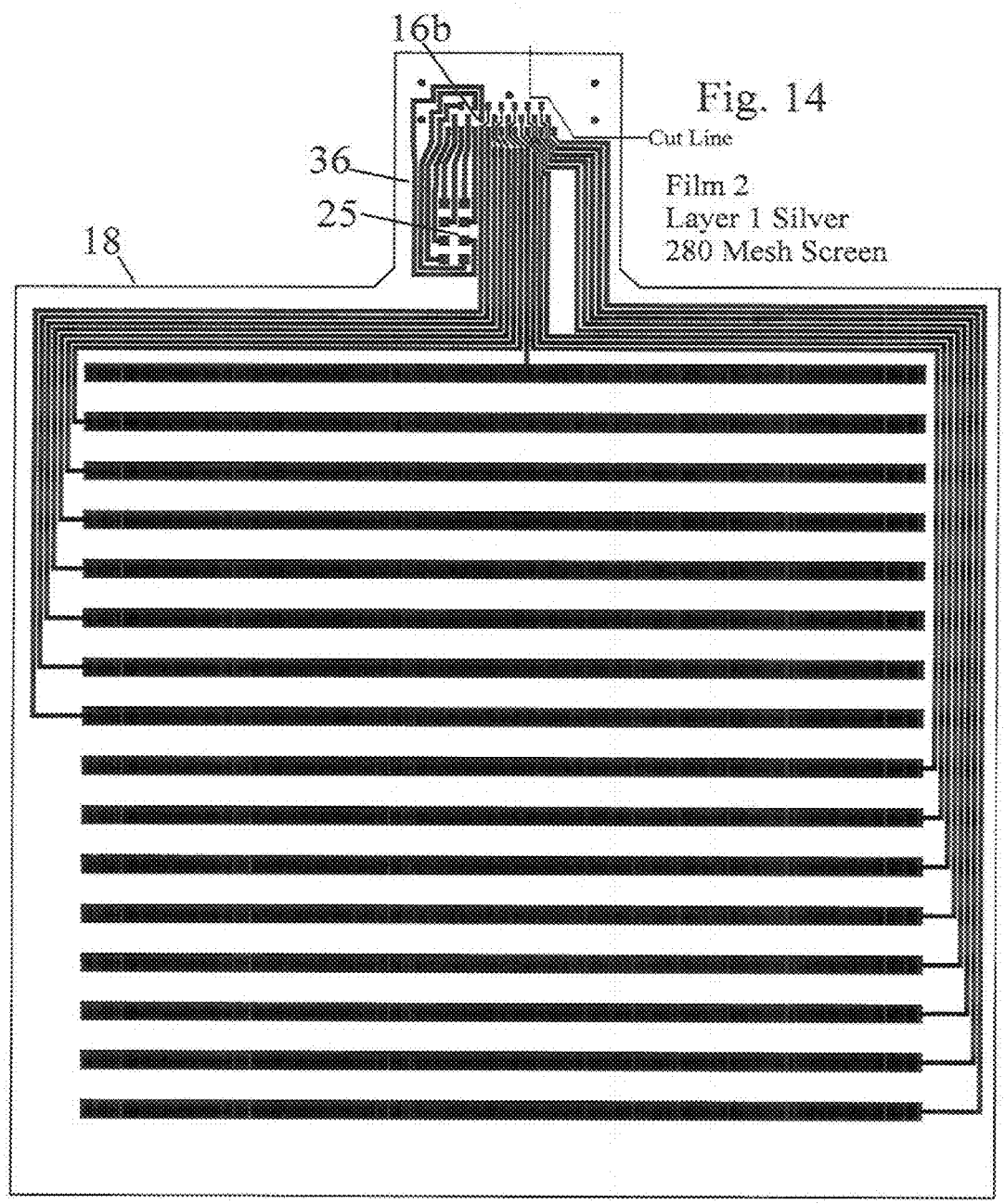
FIG. 14 depicts the silver ink screen print pattern of the top side of film 2 layer 1 of an embodiment of the inventive force sensing pad.
Figure 15:
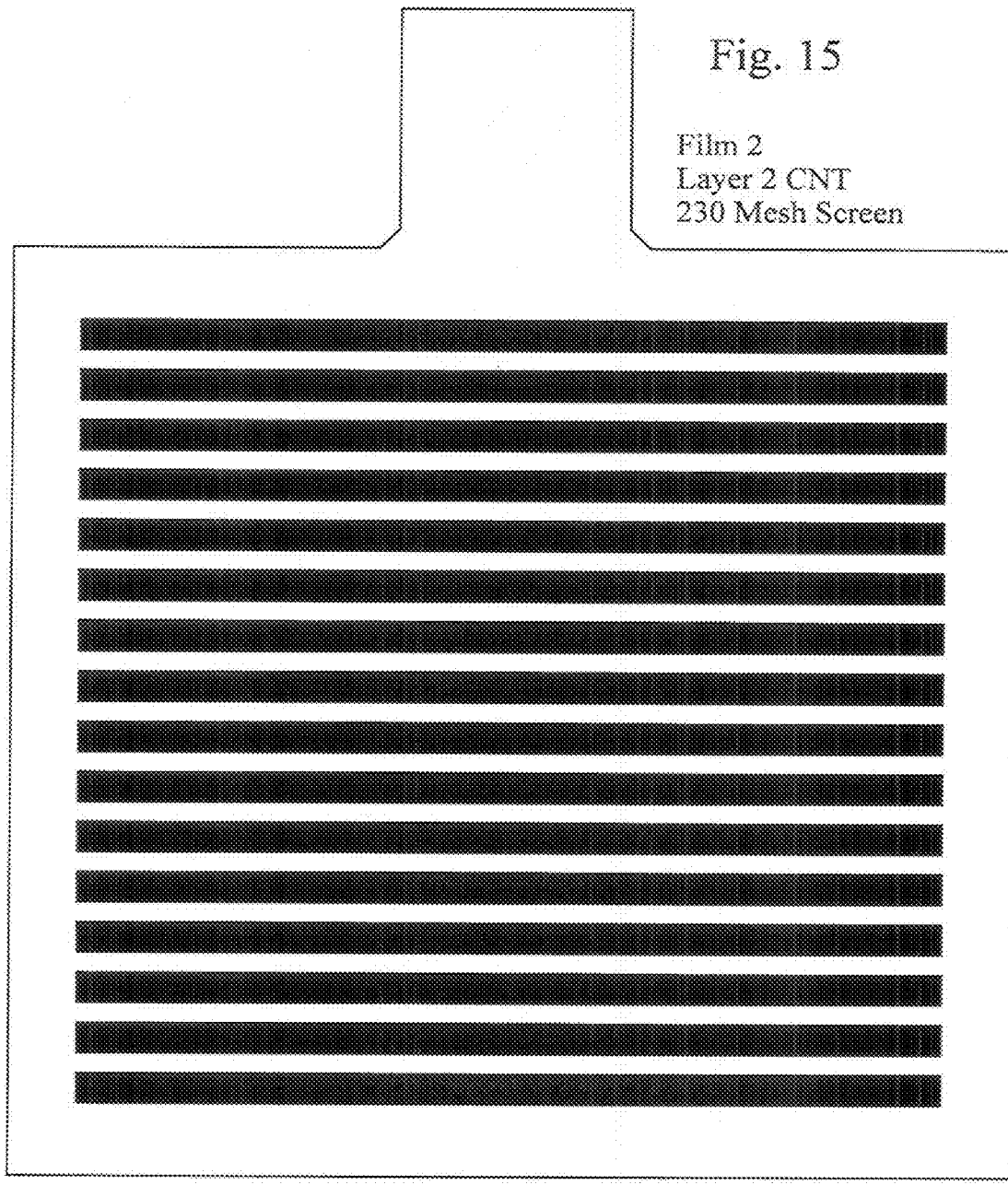
FIG. 15 illustrates the UV-cured carbon nanotube ink screen print pattern of the top side of film 2 layer 2 of an embodiment of the present invention.
Figure 16:
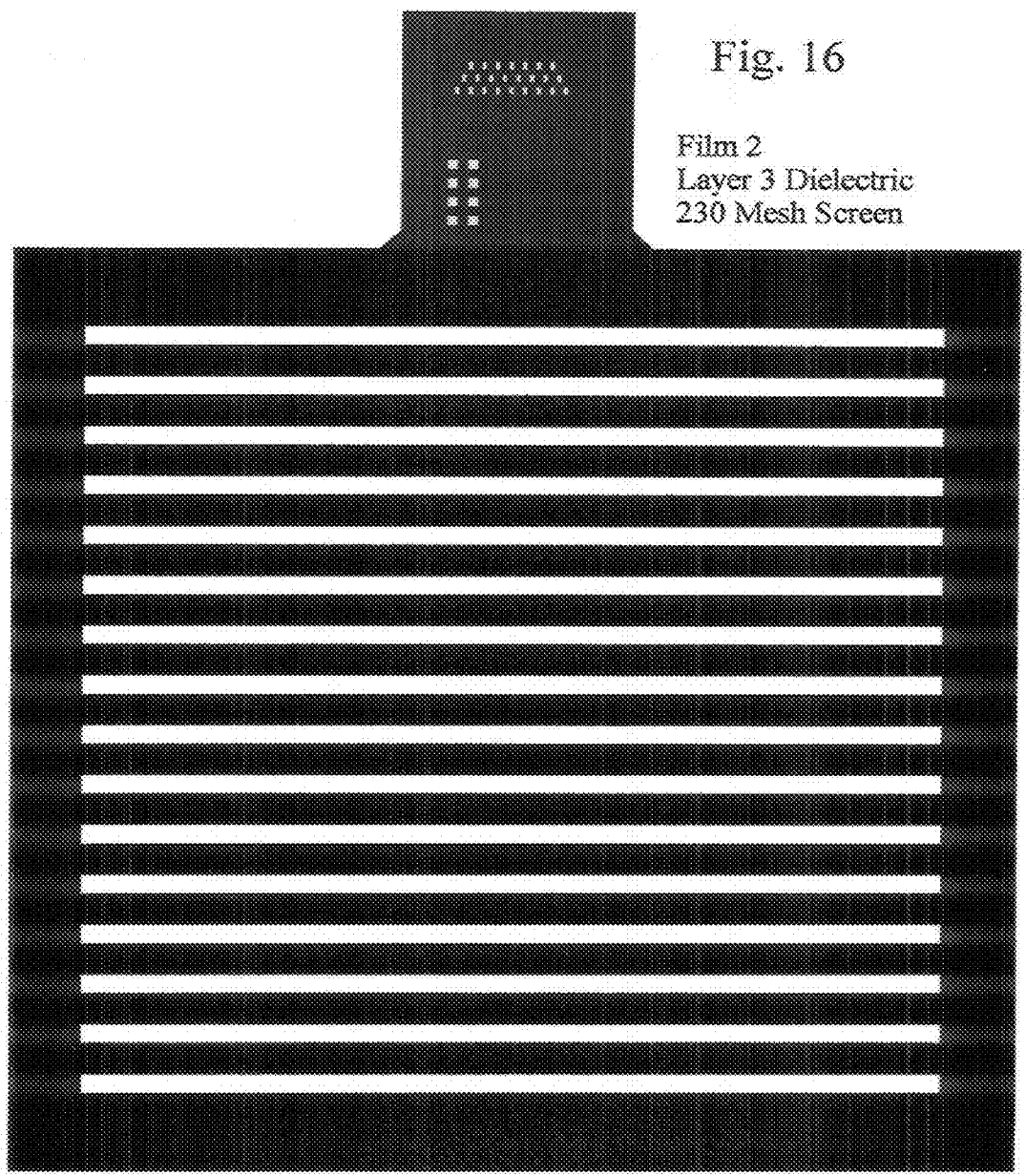
FIG. 16 shows the UV-cured dielectric ink screen print pattern of the top side of film 2 layer 3 of an embodiment of the inventive force sensing pad.
Figure 17:
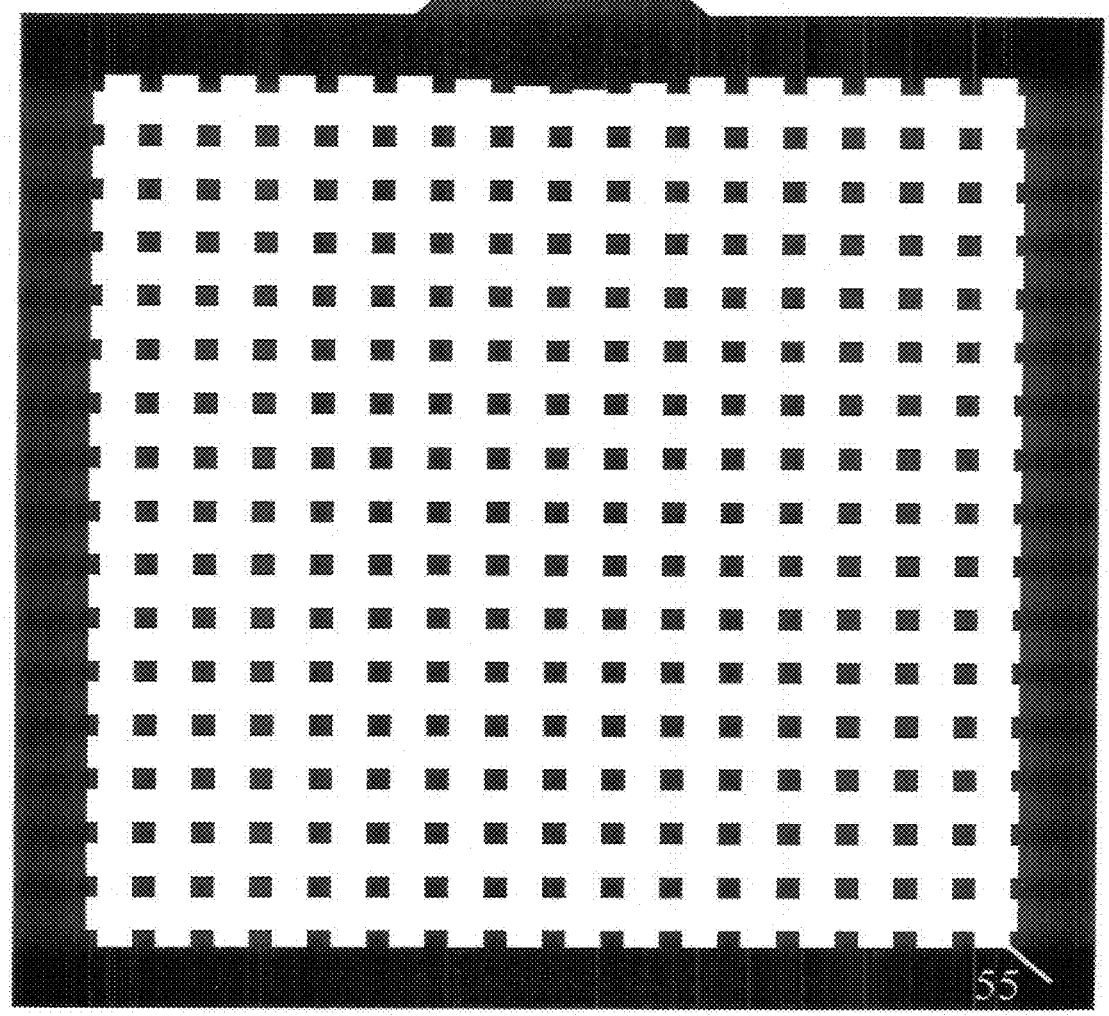
FIG. 17 depicts the UV-cured adhesive ink screen print pattern of the top side of film 2 layer 4 of an embodiment of the present invention.

Silver circuit trace 36 is preferably screen printed on a second elastomeric (thermoplastic polyurethane) film 18 and is preferably printed from the screen pattern of FIG. 14 as Film 2 Layer 1. A patch of conductive z-axis tape 37 is preferably placed over the exposed silver pad 16b of trace 36 to complete the connection to the circuit board.

Silver circuit trace 38 is preferably screen printed on a third elastomeric (thermoplastic polyurethane) film 19 and is preferably printed and cut from a section of screen pattern FIG. 18 as Film 3 Side A Layer 1. A patch of conductive z-axis tape 39 is preferably placed over the exposed silver pad of trace 38 to complete the connection to the circuit board.

Figure 8:
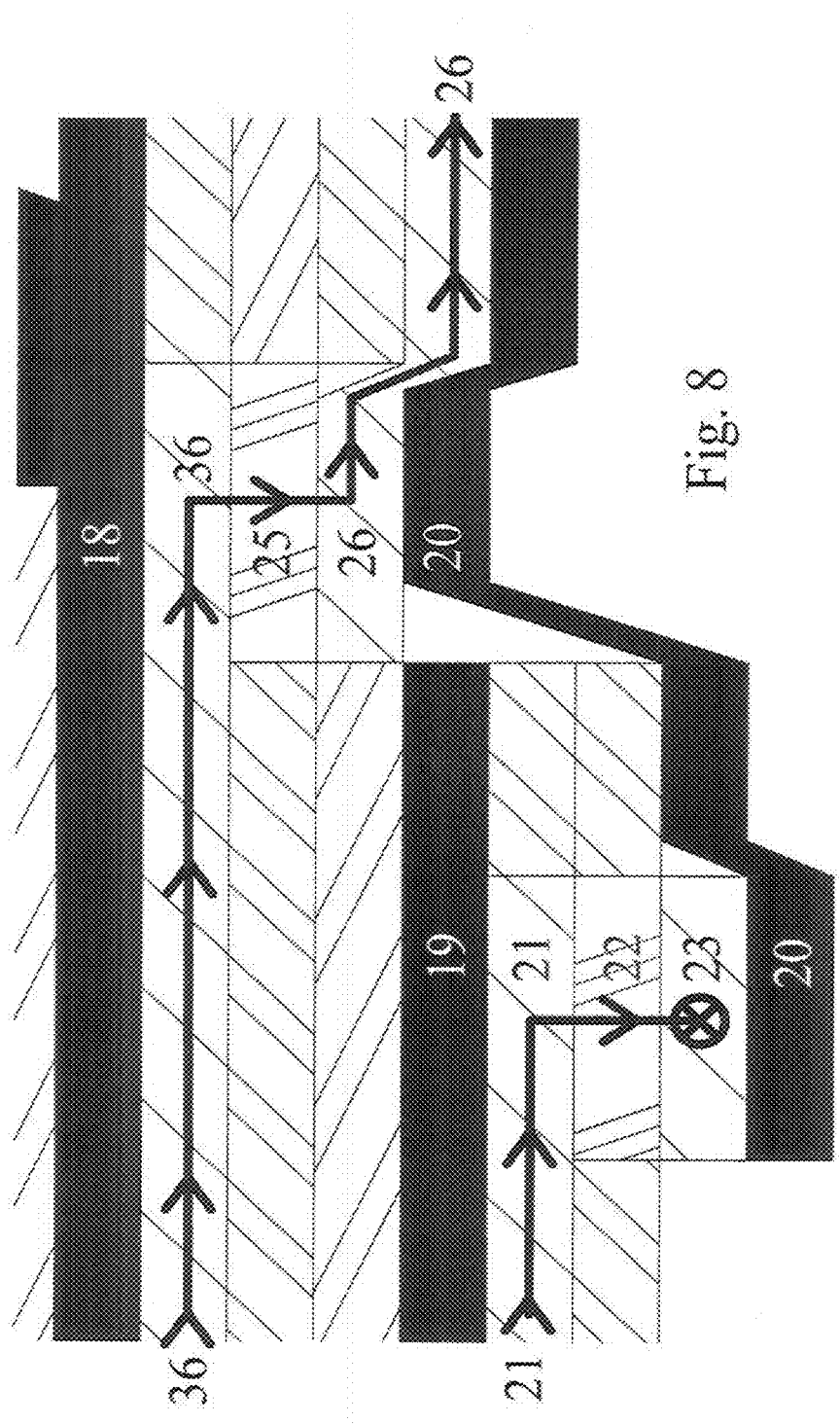
FIG. 8 provides an enlarged view (not to scale) of FIG. 2 taken at lines 92 showing circuit trace connections between two adjacent film layers.

Moving to the right of the three connection pads of FIG. 2 (section taken at lines 92) are two film to film circuit connections detailed in an expanded view in FIG. 8.

Silver circuit trace 36 is preferably screen printed on second elastomeric (thermoplastic polyurethane) film 18 of FIG. 14 as Film 2 Layer 1. Silver circuit trace 26 is preferably screen printed on fourth elastomeric (thermoplastic polyurethane) film 20 of FIG. 11 as Film 1 Layer 1. At the junction pads of traces 36 and 26 conductive z-axis tape 25 preferably connects the two circuits together.

Silver circuit trace 21 is preferably screen printed on third elastomeric (thermoplastic polyurethane) film 19 and is preferably printed and cut from a section of screen pattern FIG. 18 as Film 3 Side A Layer 1. Silver circuit trace 23 is preferably screen printed on fourth elastomeric (thermoplastic polyurethane) film 20 as Film 1 Layer 1. At the junction pads of traces 21 and 23 conductive z-axis tape 22 preferably connects the two circuits together.

Figure 9:
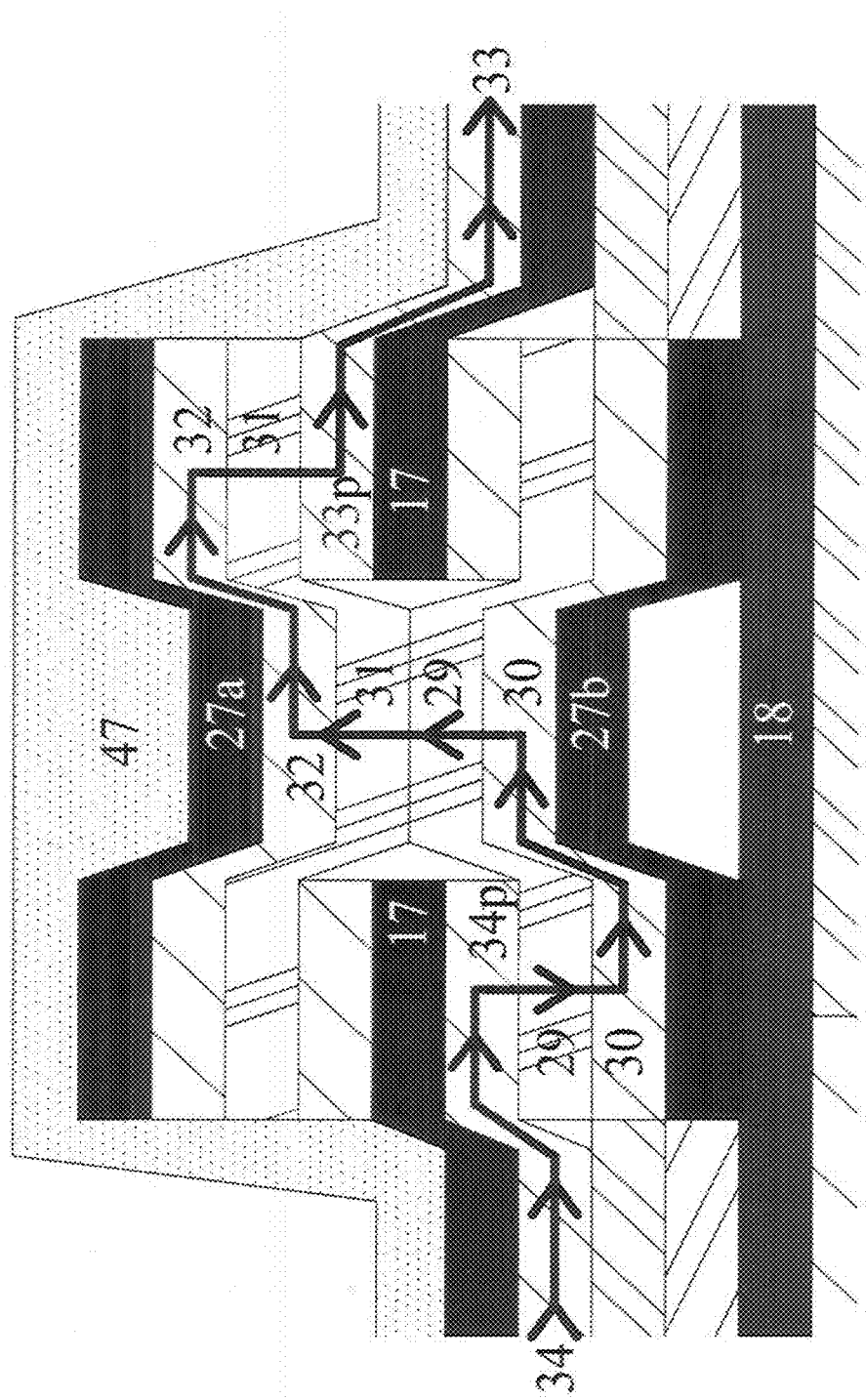
FIG. 9 gives an enlarged view (not to scale) of FIG. 2 taken at lines 94 illustrating a circuit trace through hole via connecting the two sides of a substrate film.

Moving to the right of the two film to film circuit connections of FIG. 2 (section taken at lines 94) is a through hole via detailed in an expanded view in FIG. 9. Silver circuit trace 34 and pad 34p are preferably screen printed on first elastomeric (thermoplastic polyurethane) film 17 and are preferably printed from the screen pattern of FIG. 18 as Film 3 Side A. Layer 1. Silver circuit trace 33 and pad 33p are preferably screen printed on first elastomeric (thermoplastic polyurethane) film 17 and are preferably printed from the screen pattern of FIG. 21 as Film 3 Side B Layer 1. Trace pads 34p and 33p are preferably on opposing sides centered on a common hole through film 17. To connect traces 34 and 33 silver pads 30 and 32 on films 27b and 27a respectively are preferably cut from silver screen printed film from the pattern of FIG. 18 as Film 3 Side Layer 1. Conductive z-axis tape patches 29 and 31 are preferably placed over pads 30 and 32 and pressed onto pads 34p and 33p respectively to complete the circuit from trace 34 to 33.

Figure 10:
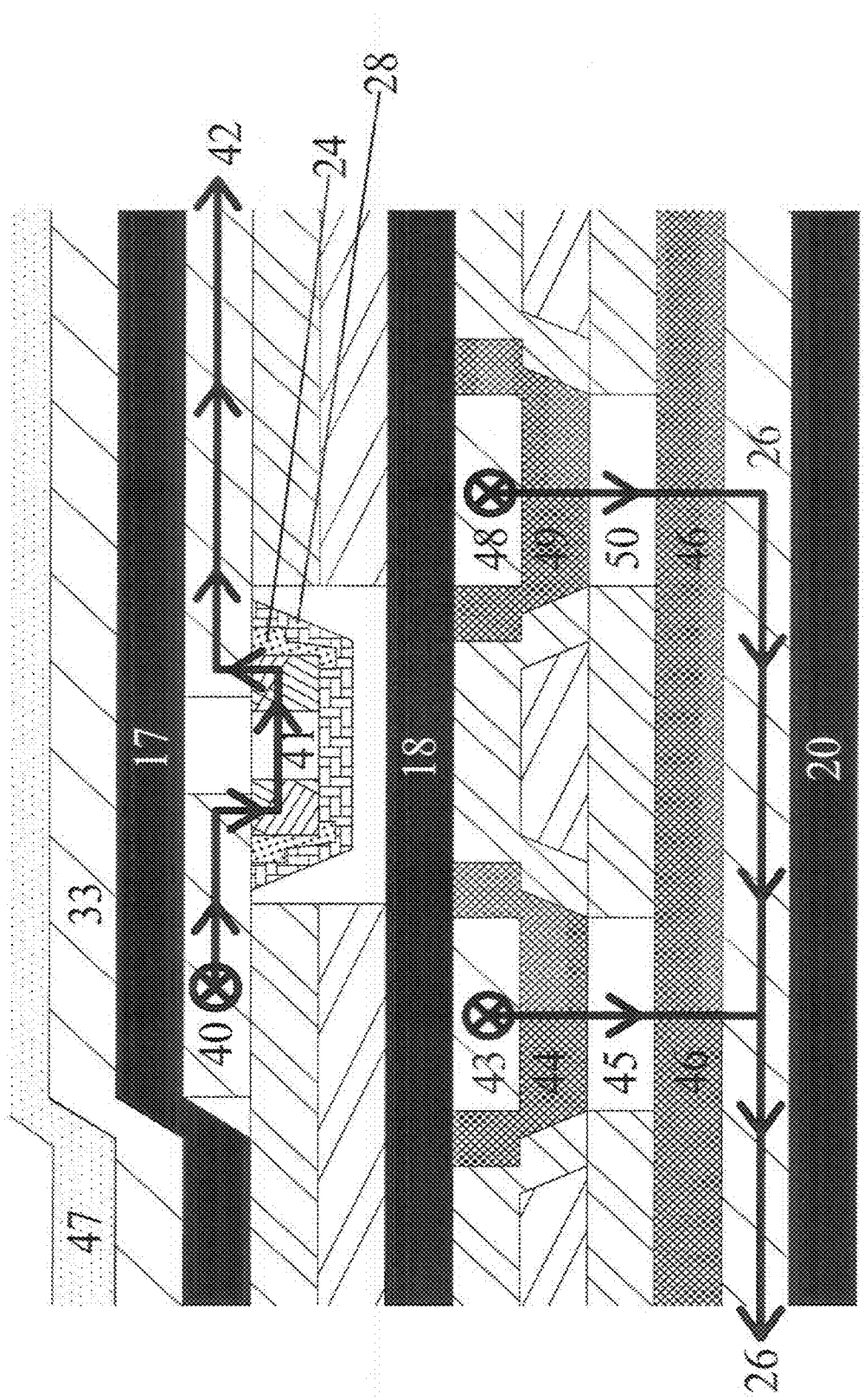
FIG. 10 depicts an enlarged view (not to scale) of FIG. 2 taken at lines 96 showing two force sensor cells and a temperature sensor cell.

To the right of the through hole via (section taken at lines 96 of FIG. 2) are two force sensor cells centered on 45 and 50 of FIG. 10. The force cells components are horizontal row silver circuit traces 43 and 48 preferably screen printed on second elastomeric (thermoplastic polyurethane) film 18 and are preferably printed from the screen pattern of FIG. 14 as Film 2 Layer 1; Horizontal row carbon nanotube resistive layers 44 and 49 preferably screen printed on second elastomeric (thermoplastic polyurethane) film 18 and preferably printed from the screen pattern of FIG. 15 as Film 2 Layer 2; air gaps 45 and 50 are trapped between the films during lamination; Vertical column carbon nanotube resistive layer 46 preferably screen printed on fourth elastomeric (thermoplastic polyurethane) film 20 and preferably printed from the screen pattern of FIG. 12 as Film 1 Layer 2; and finally vertical column silver circuit trace 26 preferably screen printed on fourth elastomeric (thermoplastic polyurethane) film 20 and preferably printed from the screen pattern of FIG. 11 as Film 1 Layer 1. The force cells centered on 45 and 50 are identical in operation and a detail description of the cell centered on 45 will apply to all force cells.

In operation, a horizontal row silver circuit trace such as 43 is driven with an excitation voltage. If a force is applied normal to the plane of the force pad then carbon nanotube resistive layers 44 and 46 are pressed against each other forcing the air out of the gap 45 and into adjoining cells that have lower applied force on them. The opposing surfaces of carbon nanotube layers 44 and 46 are preferably textured from the screen printing process and initially at lower applied force only the peaks of the textured surfaces are in contact. Carbon nanotube layers 44 and 46 are preferably made from a tough flexible elastomeric resin that will resist compression of the opposing surfaces into each other; however, as the force is increased the surfaces of 44 and 46 conform to each other and the contact area between the two surfaces increases. The increased surface area lowers the contact resistance and increases the current flow back to the circuit board over silver circuit trace 26.

The force sensor cells disclosed herein differ from those known in the art in that carbon-nanotubes are used as the conductive filler for the resistive resin and not carbon black, graphite, molybdenum disulfide, or some other semiconductive material. The advantage is with the much higher aspect ratio of carbon nanotubes, much lower loadings of conductive filler is needed and thus the physical properties of the resin are less impacted by filler content. In one embodiment of the inventive force pad, the carbon nanotube loading in the resin may vary from preferably 1% to 5%, more preferably 2.5% carbon nanotubes by weight. Another advantage of the present invention is that no additional filler is added to generate the micro protrusions on the surface of the resistive layers required by some other inventions which reduces the filler load in the resin.

Above the force sensor cells in FIG. 10 is thermistor 41 connected to silver circuit traces 40 and 42 silver screen printed on film 17 from the pattern of FIG. 18 as Film 3 Layer 1. The thermistor is preferably connected with silver epoxy and encapsulated with a tough flexible elastomeric resin for strain relief.

Detailed in FIG. 21 is a moisture sensor screen printed as two silver circuit traces forming two juxtaposed comb circuits 33 and 51 on film 17 from the screen pattern of FIG. 21 as Film 3 Side B Layer 1. A thin aqueous polyurethane dispersion shown as 47 in FIGS. 9 and 10 is applied over the top of the comb traces. Moisture will penetrate the polyurethane layer deposited over the comb circuits and increase the conductivity between the two comb circuits. In Example 2, a variation of the moisture sensor is disclosed where by the aqueous polyurethane dispersion is replaced by the carbon nanotube coating used in the force cells. This embodiment has the advantage in that it can be screen printed. Moisture penetrating the carbon nanotube coating will interfere with the conduction through the carbon nanotubes and decrease the conductivity between the two comb circuits.

Dielectric layers are preferably applied as insulating protective layers between conductive layers.

Adhesive layers are preferably used to seal the layers into one assembly during the lamination process.

EXAMPLES

The present invention is further illustrated, but is not to be limited, by the following examples. All quantities given in "parts" and "percents" are understood to be by weight, unless otherwise indicated. The following materials were used in preparing the conductive UV curable coatings of the examples:

| | |
|---|---|
| AQUEOUS POLYURETHANE DISPERSION | commercially available as BAHYDROL 124 from Bayer MaterialScience LLC; |
| FLEXIBLE SILVER INK | commercially available as CI-1036 from Engineered Conductives Materials, LLC; |
| THERMOPLASTIC POLYURETHANE | 5 mil polyester TPU film commercially available as PS5300 from Bayer MaterialScience LLC; |
| Z-AXIS CONDUCTIVE TAPE | commercially available as Tape 9703 from 3M; |
| UV CURED CNT CONDUCTIVE INK | as disclosed in co-pending U.S. patent application Ser. No. 13/082,768, filed on an even date herewith and identified by Attorney Docket No. MD-09-026A/BMS112010 |
| UV CURED DIELECTRIC INK with the following formulation | |
| 61% ACRYLATE | a UV curable, aliphatic urethane acrylate commercially available as DESMOLUX U100 from Bayer MaterialScience LLC; |
| 26.1% MONOMER | a UV curable isobornyl acrylate commercially available as SR-506 from Sartomer USA, LLC |
| 3.6% PHOTOINITIATOR | phosphine oxide, phenyl bis(2,4,6-trimethyl benzoyl)/80% 2-hydroxy-2-methyl-1-phenyl-1-propanone, commercially available as IRGACURE 2022 from Ciba Specialty Chemicals, Inc.; |
| 9.3% Silica | commercially available as ACEMATT TS 100 from Evonik DeGaussa |
| UV CURED ADHESIVE | commercially available as # 3MSP7514 from 3M; |
| THERMISTOR | PTC 4.7K Ohm 1% 0805 Package, commercially available as # 541-1186-1-ND from Digi-Key Corporation; |
| CONDUCTIVE SILVER EPOXY | commercially available as # 29840 from Henkel/Loctite Corporation; |
| UV CURED ENCAPSULANT INK | same as UV CURED DIELECTRIC INK |
| ALUMINUM SHEET | 24" × 20" × 80 mil rounded corners, commercially available from Signs And Blanks, LLC; |

Example 1

Three films of 5 mil THERMOPLASTIC POLYURETHANE, measuring 19"×23.5" were dry laminated onto ALUMINUM SHEETS for support during the screen printing process.

Using the art work in FIGS. 11 through 21 (minus the number indicators added for clarity of the Detailed Description of Invention), each film was printed using polyester screens of mesh size, ink and layer order as noted on the Figures.

The FLEXIBLE SILVER INK was cured for 10 minutes at 110° C.

UV CURED CNT CONDUCTIVE INKs were cured with the following UV exposure.

UVA 249 mJ/cm$^2$
UVB 210 mJ/cm$^2$
UVC 60 mJ/cm$^2$
UVV 185 mJ/cm$^2$

Film 3 Side B of FIG. 21 was printed first. The film was then turned over and Side A layers of FIGS. 18 to 20 were printed leaving the film ready for mounting the THERMISTORS. THERMISTORS were mounted on the eight pad sets beginning with pads 42 and 40 on Film 3 Side A using CONDUCTIVE SILVER EPOXY and cured for 24 hours.

Two holes $3/16$" diameter and centered on pads 34$p$ and 52$p$ were cut out of Film 3. Z-AXIS CONDUCTIVE TAPE was applied to the silver side of four silver printed squares that were cut from a previous completed force pad. One square was affixed to each of the pads 34$p$ and 52$p$ of Film 3 Side A and pads 33$p$ and 51$p$ of Film 3 Side B to complete the through hole via's.

Figure 11:
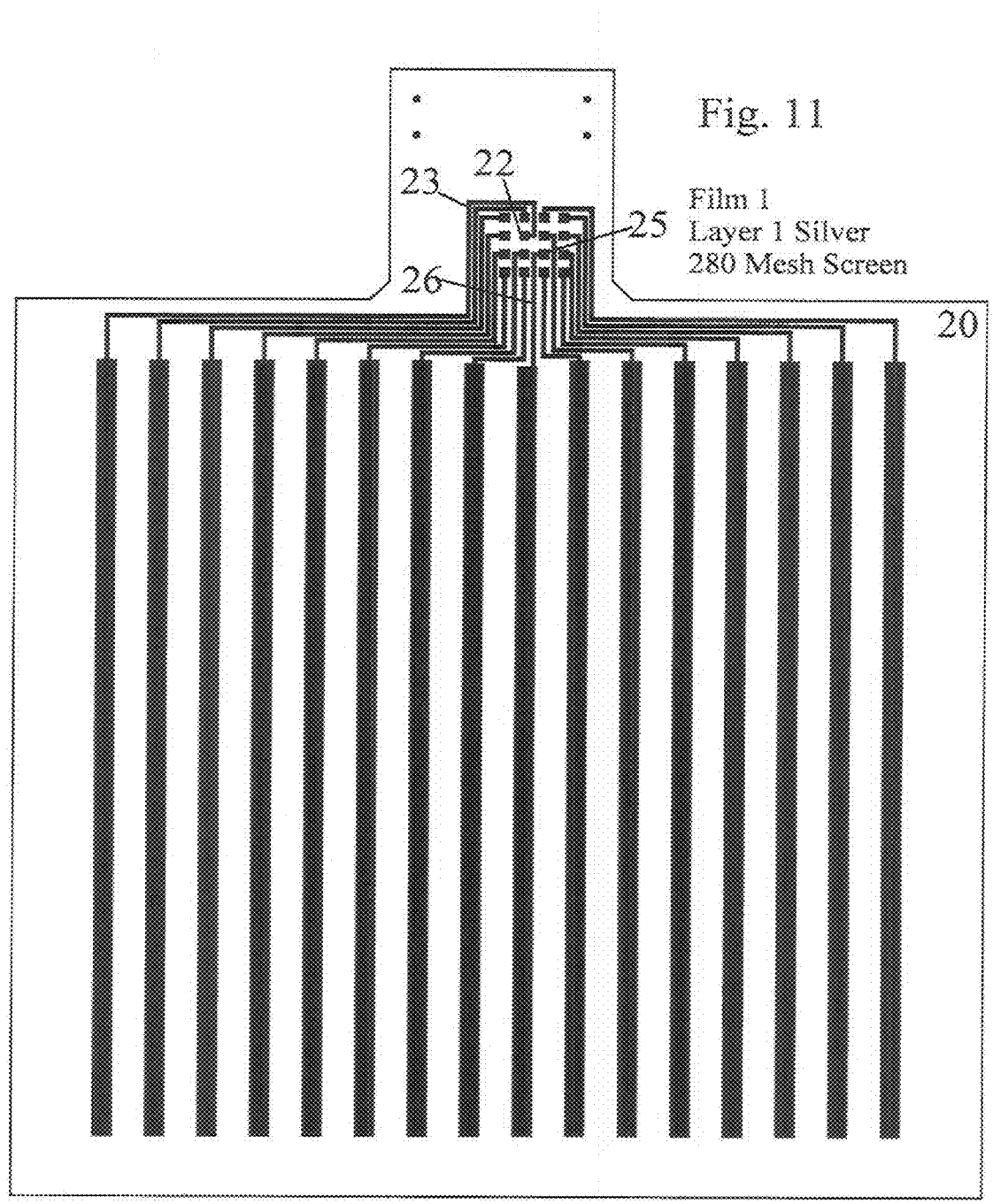
FIG. 11 provides a representation of the silver ink screen print pattern of the top side of film 1 layer 1 of an embodiment of the inventive force sensing pad.
Figure 12:
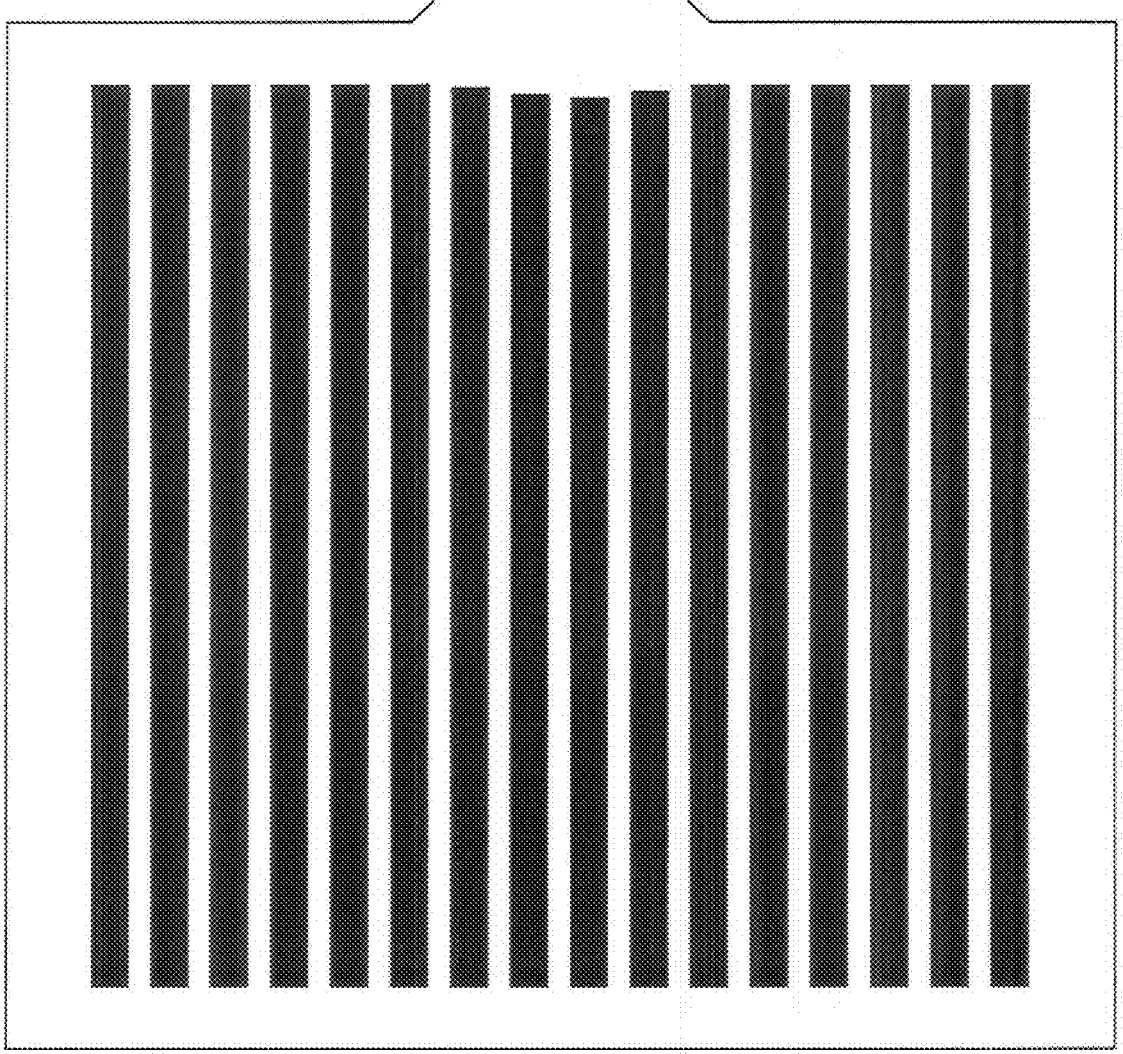
FIG. 12 illustrates the UV-cured carbon nanotube ink screen print pattern of the top side of film 1 layer 2 of an embodiment of the force sensing pad of the present invention.
Figure 13:
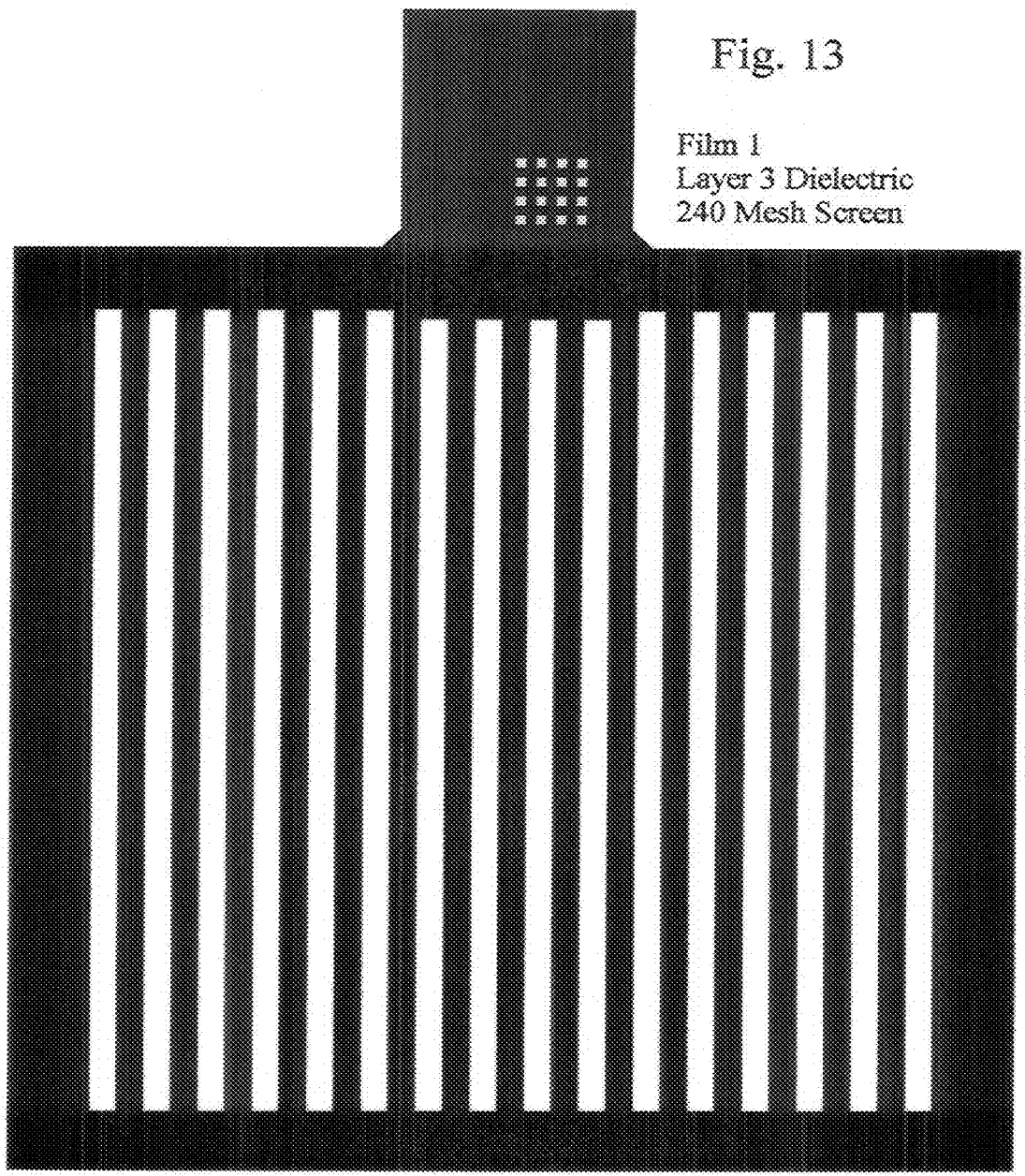
FIG. 13 shows the UV-cured dielectric ink screen print pattern of the top side of film 1 layer 3 of an embodiment of the inventive force sensing pad.

Printed Film 1 of FIG. 11 was removed from the ALUMINUM SHEET, placed on a vacuum table and held down flat with printed side down. Polyester release film was laminated to Film 1 for support and removed from the vacuum table. The printed silver side will be exposed with the release film on the opposite side.

Film 2 of FIG. 14 was cut along the cut line, removed from the ALUMINUM SHEET, placed on the vacuum table and held down flat with printed side up. Polyester release film was laminated to Film 2 for support and removed from the vacuum table.

Film 3 was removed from the ALUMINUM SHEET, placed on the vacuum table and held down flat with Side A up. The top edge of the film above the FIG. 18 label was taped down to the vacuum table. A 4"×6" piece of release film was placed over the film section 19 as shown in FIG. 18 to protect it from laminating to Film 2. A larger release film was laminated over the complete Side A of Film 3.

Film 2 was aligned over Film 3 printed side up. The top edge of Film 2 was taped down over the top edge of Film 3. Film 2 was lifted by the bottom edge and the release film over Film 3 was removed and Film 2 was laminated to Film 3 with enough force to remove all air between the two films.

The release film over Film 2 was temporally rolled back to exposed the area between registration mark 53$b$ and pad 34$p$. Film section 19 that was cut from Film 3 of a previously completed force pad was laminated onto Film 2 with printed side up and aligned with registration marks 53$a$ over 53$b$ and 54$a$ over 54$b$.

On Film 1 the array of 16 silver pads each $1/4$" square as shown in FIG. 11 were covered with Z-AXIS CONDUCTIVE TAPE and covered with release film.

Film 1 was aligned over Film 2 with the printed side down juxtapose to the printed side of film 2. The top edge of Film 1 was taped down over the top edge of Film 2.

The bottom edge of Film 1 was lifted up and the release film over Film 2 was removed, the release film over the array of 16 silver pads was removed and Film 1 was laminated to Film 2. A light pressure was applied during the lamination to not push out all the air between the two films. After the lamination, higher pressure may be applied to the edges of the pad to secure the edges and air entrapment. A fill port 55 is shown on FIG. 17 in the adhesive layer between Films 1 and 2. Films 1 and 2 may be separated at the adjacent corner to 55 and a hypodermic needle used to add air to the cavity between the films.

Film section 19 and the nine silver printed squares next to it, as shown on FIG. 18 were cut out for later use on the next pad assembly.

A thin coating of AQUEOUS POLYURETHANE DISPERSION was applied to the exposed silver traces of the moisture sensor of FIG. 21 to protect the silver traces and act as a permeable membrane to moisture.

The force pad was trimmed along the outside edge and was ready for mounting the controller board using Z-AXIS CONDUCTIVE TAPE over the exposed connection pads.

Example 2

A strip $3/16$"×1" of the UV CURED CNT CONDUCTIVE INK was printed between two electrodes and exposed to varying levels of humidity. As the humidity increased the resistance of the strip increased.

The foregoing examples of the present invention are offered for the purpose of illustration and not limitation. It will be apparent to those skilled in the art that the embodiments described herein may be modified or revised in various ways without departing from the spirit and scope of the invention. The scope of the invention is to be measured by the appended claims.

What is claimed is:

1. A flexible sensing material comprising:
   (a) at least one flexible elastomeric polyurethane layer; and
   (b) at least one conductive, curable coating layer comprising:
      about 0.01 wt. % to about 5 wt. % of multi-walled carbon nanotubes having a diameter of greater than about 4 nm;
      about 10 wt. % to about 99 wt % of an aliphatic urethane acrylate; and
      about 0.1 wt. % to about 15 wt. % of a photoinitiator, wherein the weight percentages are based on the weight of the formulation, wherein the coating layer is curable by exposure to radiation and wherein the cured coating layer has a surface resistivity of about $10^2 \Omega/\square$ to about $10^{10} \Omega/\square$.

2. The flexible elastomeric sensing material according to claim 1, wherein the flexible polyurethane layer comprises a thermoplastic polyurethane.

3. The flexible sensing material according to claim 1, wherein the multi-walled carbon nanotubes are present in the coating layer in an amount of about 0.1 wt. % to about 3 wt. %.

4. The flexible sensing material according to claim 1, wherein the multi-walled carbon nanotubes are present in the coating layer in an amount of about 2 wt. % to about 3 wt. %.

5. The flexible sensing material according to claim 1, wherein the aliphatic urethane acrylate is present in the coating layer in an amount of about 50 wt. % to about 90 wt. %.

6. The flexible sensing material according to claim 1, wherein the aliphatic urethane acrylate is present in the coating layer in an amount of about 40 wt. % to about 80 wt. %.

7. The flexible sensing material according to claim 1, wherein the photoinitiator is present in the coating layer in an amount of about 1 wt. % to about 7 wt. %.

8. The flexible sensing material according to claim 1, wherein the photoinitiator is present in the coating layer in an amount of about 3 wt. % to about 5 wt. %.

9. The flexible sensing material according to claim 1, wherein the coating is curable by exposure to radiation of about 200 to about 420 nm.

10. The flexible sensing material according to claim 1, wherein the photoinitiator is selected from 20% phosphine oxide, phenyl bis(2,4,6-trimethyl benzoyl)/80% 2-hydroxy-2-methyl-1-phenyl-1-propanone and 1-hydroxycyclohexyl benzophenone.

11. The flexible sensing material according to claim 1 further including at least one sensor.

12. The flexible sensing material according to claim 11, wherein the sensor measures a parameter selected from the group consisting of temperature, moisture and pressure.

13. The flexible sensing material according to claim 1, wherein the multi-walled carbon nanotubes are non-functionalized.

14. The flexible sensing material according to claim 1, wherein the multi-walled carbon nanotubes have a diameter of about 5 nm to about 20 nm.

15. A process for producing a flexible sensing material comprising combining:
(a) at least one flexible elastomeric polyurethane layer; and
(b) at least one conductive, curable coating layer comprising:
about 0.01 wt. % to about 5 wt. % of multi-walled carbon nanotubes having a diameter of greater than about 4 nm;
about 10 wt. % to about 99 wt. % of an aliphatic urethane acrylate; and
about 0.1 wt. % to about 15 wt. % of a photoinitiator, wherein the weight percentages are based on the weight of the formulation, wherein the coating layer is curable by exposure to radiation and wherein the cured coating layer has a surface resistivity of about $10^2 \Omega/\square$ to about $10^{10}\Omega/\square$.

16. The process according to claim 15, wherein the multi-walled carbon nanotubes are present in the coating layer in an amount of about 0.1 wt. % to about 3 wt. %.

17. The process according to claim 15, wherein the multi-walled carbon nanotubes are present in the coating layer in an amount of about 2 wt. % to about 3 wt. %.

18. The process according to claim 15, wherein the aliphatic urethane acrylate is present in the coating layer in an amount of about 50 wt. % to about 90 wt. %.

19. The process according to claim 15, wherein the aliphatic urethane acrylate is present in the coating layer in an amount of about 40 wt. % to about 80 wt. %.

20. The process according to claim 15, wherein the photoinitiator is present in the coating layer in an amount of about 1 wt. % to about 7 wt, %.

21. The process according to claim 15, wherein the photoinitiator is present in the coating layer in an amount of about 3 wt. % to about 5 wt. %.

22. The process according to claim 15, wherein the photoinitiator is selected from 20% phosphine oxide, phenyl bis(2, 4,6-trimethyl benzoyl)/80% 2-hydroxy-2-methyl-1-phenyl-1-propanone and 1-hydroxycyclohexyl benzophenone.

23. The process according to claim 15, wherein the multi-walled carbon nanotubes are non-functionalized.

24. The process according to claim 15, wherein the multi-walled carbon nanotubes have a diameter of about 5 nm to about 20 nm.

25. The process according to claim 15, wherein the coating layer is cured by exposure to radiation of about 200 nm to about 420 nm.

* * * * *